US010461141B2

(12) United States Patent
Choi

(10) Patent No.: US 10,461,141 B2
(45) Date of Patent: Oct. 29, 2019

(54) DISPLAY DEVICE AND METHOD OF MANUFACTURING THE SAME

(71) Applicant: LG Display Co., Ltd., Seoul (KR)

(72) Inventor: Heedong Choi, Paju-si (KR)

(73) Assignee: LG Display Co., Ltd., Seoul (KR)

(\*) Notice: Subject to any disclaimer, the term of this patent is extended or adjusted under 35 U.S.C. 154(b) by 0 days.

(21) Appl. No.: 16/154,717

(22) Filed: Oct. 9, 2018

(65) Prior Publication Data

US 2019/0131369 A1  May 2, 2019

(30) Foreign Application Priority Data

Oct. 31, 2017 (KR) .................. 10-2017-0143311

(51) Int. Cl.
*H01L 27/32* (2006.01)
*H01L 27/12* (2006.01)

(52) U.S. Cl.
CPC ...... *H01L 27/3262* (2013.01); *H01L 27/3276* (2013.01); *H01L 27/124* (2013.01); *H01L 27/3265* (2013.01); *H01L 27/3272* (2013.01); *H01L 2227/323* (2013.01)

(58) Field of Classification Search
CPC ............ H01L 27/124; H01L 27/3262; H01L 27/3265; H01L 27/3272; H01L 27/3276; H01L 2227/323

See application file for complete search history.

(56) References Cited

U.S. PATENT DOCUMENTS

| 4,984,033 A * | 1/1991 | Ishizu | H01L 21/0242 257/98 |
| 8,310,612 B2 * | 11/2012 | Cho | G02F 1/136227 349/138 |
| 2008/0067519 A1 * | 3/2008 | Sakurai | G02F 1/136213 257/72 |
| 2011/0079784 A1 * | 4/2011 | Im | H01L 27/3262 257/59 |
| 2011/0084262 A1 * | 4/2011 | Kondratyuk | H01L 29/78645 257/43 |
| 2015/0162363 A1 * | 6/2015 | Kim | H01L 27/1262 257/72 |

\* cited by examiner

*Primary Examiner* — Peniel M Gumedzoe
(74) *Attorney, Agent, or Firm* — Fenwick & West LLP

(57) ABSTRACT

A display device includes a gate insulating layer disposed on a channel region of a semiconductor layer. A gate electrode is disposed on the gate insulating layer over the channel region of the semiconductor layer. A source electrode is disposed in direct contact with the source region of the semiconductor layer and a drain electrode is disposed in direct contact with a drain region of the semiconductor layer. A passivation layer is disposed on the gate electrode, the source electrode, and the drain electrode. The passivation layer is in direct contact with semiconductor layer in a region between the source electrode and the gate electrode, and is in direct contact with the semiconductor layer in a region between the gate electrode and the drain electrode. The first gate electrode, the first source electrode, and the first drain electrode comprise a same layer and a same material.

20 Claims, 20 Drawing Sheets

DISPLAY DEVICE AND METHOD OF MANUFACTURING THE SAME

This application claims the priority benefit of Korean Patent Application No. 10-2017-0143311 filed on Oct. 31, 2017 which is incorporated herein by reference for all purposes as if fully set forth herein.

BACKGROUND OF THE INVENTION

Field of the Invention

The present disclosure relates to a display device and a method of manufacturing the same, and more particularly to a display device and a method of manufacturing the same for improving characteristics of thin film transistors and increasing an aperture ratio and productivity of the display device.

Discussion of the Related Art

With the development of information society, the demands for display devices displaying an image are increasing in various ways. In a field of the display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

The OLED display may include a plurality of thin film transistors and organic light emitting diodes emitting light. The thin film transistors and the organic light emitting diodes are manufactured through a photolithography process using a plurality of masks. However, because a large number of layers are used to constitute the thin film transistor, a size of the thin film transistor increases. Further, because a large number of masks are used to manufacture the thin film transistors and the organic light emitting diodes, productivity of the OLED display is reduced, and the manufacturing cost of the OLED display increases.

SUMMARY OF THE INVENTION

The present disclosure provides a display device and a method of manufacturing the same. The display device comprises a substrate, a buffer layer disposed on the substrate, and a first semiconductor layer of a first thin film transistor disposed on the buffer layer. A gate insulating layer is disposed on a channel region of the first semiconductor layer. A first gate electrode is disposed on the gate insulating layer over the channel region of the first semiconductor layer. A first source electrode is in direct contact with the source region of the first semiconductor layer. A first drain electrode is in direct contact with a drain region of the first semiconductor layer. A passivation layer is disposed on the first gate electrode, the first source electrode, and the first drain electrode. The passivation layer is in direct contact with first semiconductor layer in a region between the first source electrode and the first gate electrode. The passivation layer is also in direct contact with the first semiconductor layer in a region between the first gate electrode and the first drain electrode. The first gate electrode, the first source electrode, and the first drain electrode comprise a same layer and a same material.

In an embodiment, the display device further comprises a second semiconductor layer of a second thin film transistor disposed on the buffer layer. The gate insulating layer is further disposed on a channel region of the second semiconductor layer. A second gate electrode is disposed on the gate insulating layer over the channel region of the second semiconductor layer. A second source electrode is in direct contact with a source region of the second semiconductor. A second drain electrode is in direct contact with a drain region of the second semiconductor layer. The passivation layer is further disposed on the second gate electrode, the second source electrode, and the second drain electrode. The passivation layer is in direct contact with the second semiconductor layer in a region between the second source electrode and the second gate electrode. The passivation layer is also in direct contact with the second semiconductor layer in a region between the second gate electrode and the second drain electrode. The second gate electrode, the second drain electrode, and the second source electrode comprise the same layer and the same material as the first gate electrode, the first source electrode, and the first drain electrode.

In an embodiment, the buffer layer is in direct contact with the substrate, the first semiconductor layer is in direct contact with the buffer layer, the gate insulating layer is in direct contact with the first semiconductor layer, the first gate electrode is in direct contact with the gate insulating layer, and the passivation layer is in direct contact with the first gate electrode, the first source electrode, and the first drain electrode.

In an embodiment, the gate insulating layer is further disposed on the source region of the first semiconductor layer and on the drain region of the first semiconductor layer. The first source electrode is disposed on the gate insulating layer over the source region of the first semiconductor layer and contacts the source region of the first semiconductor layer via a first channel hole through the gate insulating layer. The first drain electrode is disposed on the gate insulating layer over the drain region of the first semiconductor layer and contacts the drain region of the first semiconductor layer via a second channel hole through the gate insulating layer.

In an embodiment, the gate insulating layer is disposed on the first semiconductor layer only on the channel region of the first semiconductor layer and is not disposed on the source region or the drain region of the first semiconductor layer.

In an embodiment, the first drain electrode is in direct contact with the drain region of the first semiconductor layer in an entire overlapping region of the first drain electrode and the drain region of the first semiconductor layer and the first source electrode is in direct contact with the source region of the first semiconductor layer in an entire overlapping region of the first source electrode and the source region of the first semiconductor layer.

In an embodiment, a light shielding layer is disposed on the substrate. The buffer layer is further disposed on the light shielding layer. A second semiconductor layer is disposed on the buffer layer over the light shielding layer. The passivation layer is further in direct contact with the second semiconductor layer over the light shielding layer. A pixel electrode is disposed on the passivation layer over the light shielding layer.

In an embodiment, a data line is disposed on the substrate. The buffer layer is further disposed on the data line. A second semiconductor layer is disposed on the buffer layer. A gate pattern is disposed over the buffer layer and in direct contact with the semiconductor layer. The gate pattern is in direct contact with the data line via a hole through the buffer layer.

In an embodiment, the gate insulating layer is further disposed on the second semiconductor layer and the buffer layer, the gate pattern is disposed on the gate insulating layer, and the hole through the buffer layer is further through the gate insulating layer.

In another embodiment, the gate pattern is in direct contact with the second semiconductor layer and the buffer layer in an entire overlapping region of the gate pattern and the second semiconductor layer.

In an embodiment, the second semiconductor layer is disposed on the buffer layer without overlapping the data line.

In another embodiment, the second semiconductor layer is disposed on the buffer layer at least partially overlapping the data line.

In an embodiment, the display device comprises an organic light emitting diode (OLED) device.

In another aspect, a manufacturing method is provided for manufacturing a display device. A buffer layer is formed on a substrate. A first semiconductor layer of a first thin film transistor is formed on the buffer layer. A gate insulating layer is formed on a channel region of the first semiconductor layer. A first gate electrode is formed on the gate insulating layer over the channel region of the first semiconductor layer. Concurrently with forming the first gate electrode, a first source electrode is formed in direct contact with a source region of the first semiconductor layer. The first source electrode has a same material as the first gate electrode. Concurrently with forming the first gate electrode and the first source electrode, a first drain electrode is formed over a drain region of the first semiconductor layer. The first drain electrode has the same material as the first gate electrode and the first source electrode. A passivation layer is formed on the first gate electrode, the first source electrode, and the first drain electrode, in direct contact with first semiconductor layer in a region between the first source electrode and the first gate electrode, and in direct contact with the first semiconductor layer in a region between the first gate electrode and the first drain electrode.

In an embodiment, a light shielding layer is formed on the substrate. The buffer layer is further formed on the light shielding layer. A second semiconductor layer is formed on the buffer layer over the light shielding layer. The passivation layer is further formed in direct contact with the second semiconductor layer over the light shielding layer. The pixel electrode is formed on the passivation layer over the light shielding layer.

In an embodiment, a second semiconductor layer of a second thin film transistor is formed on the buffer layer. The gate insulating layer is further formed on a channel region of the second semiconductor layer. A second gate electrode is formed on the gate insulating layer over the channel region of the second semiconductor layer. Concurrently with forming the second gate electrode, a second source electrode is formed in direct contact with a source region of the second semiconductor. The second source electrode comprises a same material as the second gate electrode. Concurrently with forming the second gate electrode and the second source electrode, a second drain electrode is formed in direct contact with a drain region of the second semiconductor layer. The second source electrode comprises a same material as the second gate electrode and the second source electrode. The passivation layer is formed on the second gate electrode, the second source electrode, and the second drain electrode such that the passivation layer is in direct contact with second semiconductor layer in a region between the second source electrode and the second gate electrode, and such that the passivation layer is in direct contact with the second semiconductor layer in a region between the second gate electrode and the second drain electrode.

In an embodiment, a data line is formed on the substrate and the buffer layer is further formed on the data line. A second semiconductor layer is formed on the buffer layer. A hole is formed through the buffer layer over the data line. A gate pattern is formed over the buffer layer such that the gate pattern is in direct contact with the semiconductor layer and the gate pattern is in direct contact with the data line via the hole through the buffer layer.

In an embodiment, the gate insulating layer is formed on the second semiconductor layer and the buffer layer. The gate pattern is formed on the gate insulating layer. The hole through the buffer layer is formed through the gate insulating layer.

In another embodiment, the gate pattern comprises is formed in direct contact with the second semiconductor layer and the buffer layer in an entire overlapping region of the gate pattern and the second semiconductor layer.

In an embodiment, the second semiconductor layer is formed on the buffer layer to at least partially overlap the data line.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure. Names of the respective elements used in the following explanations are selected only for convenience of writing the specification and may be thus different from those used in actual products. In the description of positional relationships, when a structure is described as being positioned "on or above", "under or below", "next to" another structure, this description should be construed as including a case in which the structures directly contact each other as well as a case in which a third structure is disposed therebetween.

A display device according to embodiments of the disclosure is a display device in which a display element is formed on a glass substrate or a flexible substrate. Examples of the display device include an organic light emitting diode (OLED) display, a liquid crystal display (LCD), and an electrophoresis display. Embodiments of the disclosure are described using the OLED display by way of example. An OLED display includes an organic layer which is formed between a first electrode serving as an anode and a second electrode serving as a cathode using an organic material. The OLED display is a self-emission display configured to form hole-electron pairs, i.e., excitons, by combining holes received from the first electrode and electrons received from the second electrode inside the organic layer and emit light by energy generated when the excitons return to a ground level.

Figure 1:
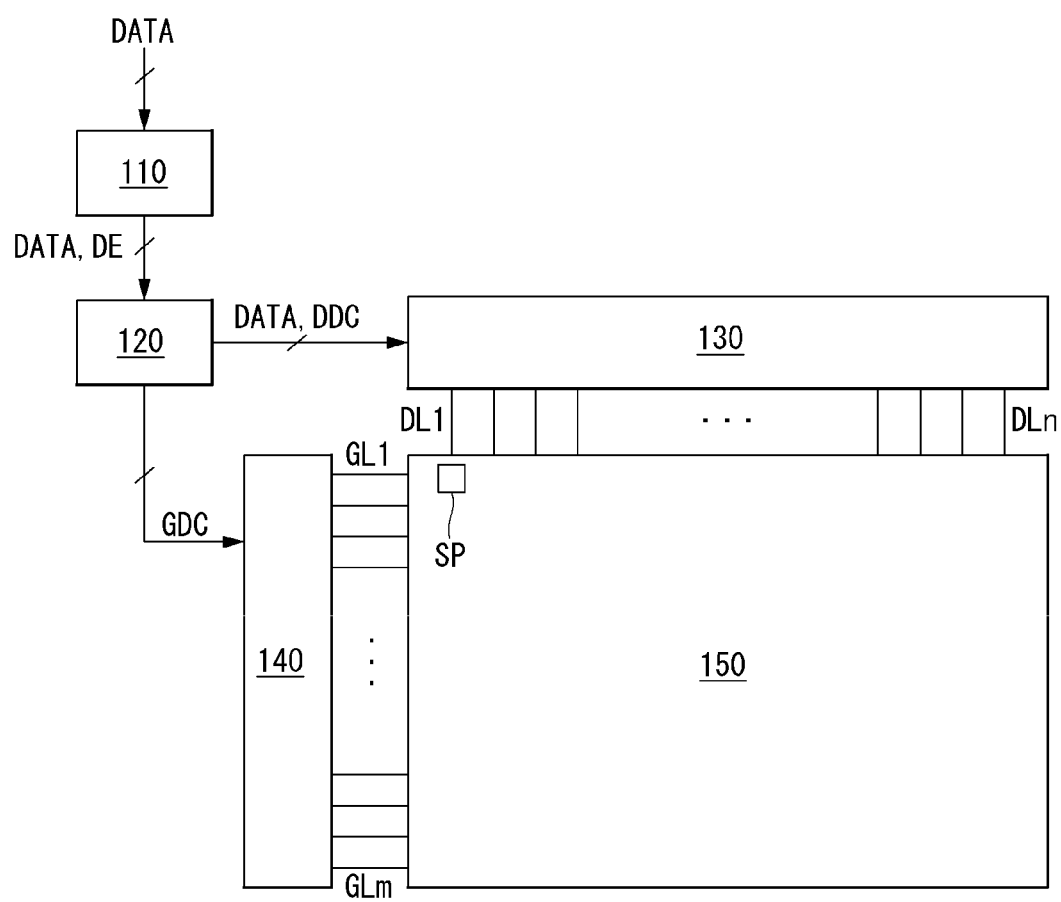
FIG. 1 is a schematic block diagram of an organic light emitting diode (OLED) display according to an embodiment of the disclosure.
Figure 2:
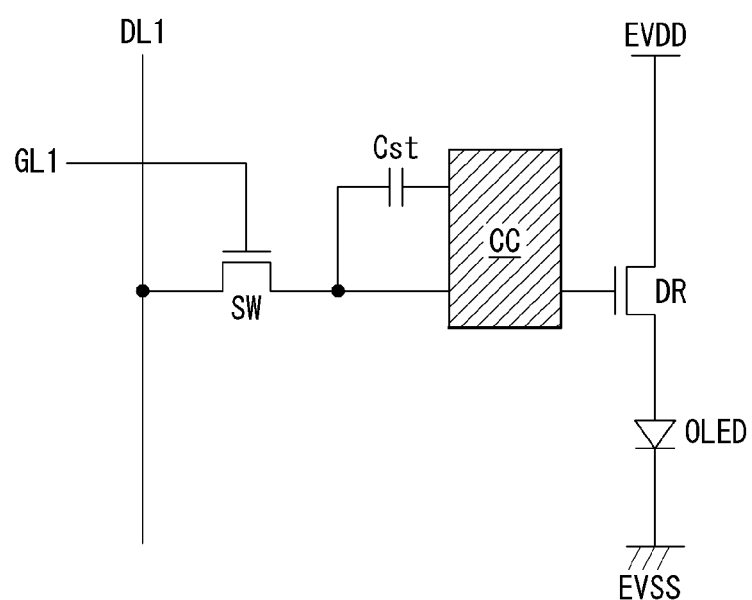
FIG. 2 schematically illustrates a circuit configuration of a subpixel.
Figure 3:
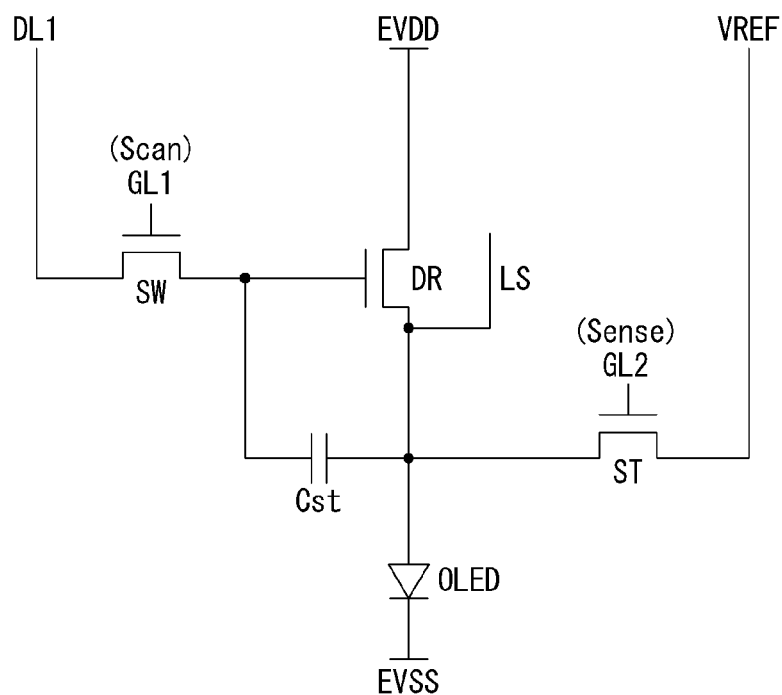
FIG. 3 illustrates in detail a circuit configuration of a subpixel.
Figure 4:
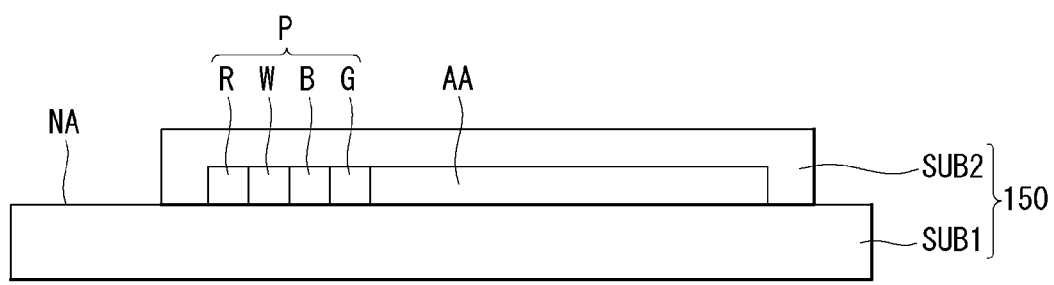
FIG. 4 is a cross-sectional view illustrating a structure of a display panel.

FIG. 1 is a schematic block diagram of an OLED display according to an embodiment of the disclosure. FIG. 2 schematically illustrates a circuit configuration of a subpixel. FIG. 3 illustrates in detail a circuit configuration of a subpixel. FIG. 4 is a cross-sectional view illustrating a structure of a display panel.

As shown in FIG. 1, an OLED display according to an embodiment of the disclosure may include an image processing unit 110, a timing controller 120, a data driver 130, a scan driver 140, and a display panel 150.

The image processing unit 110 outputs a data signal DATA, a data enable signal DE, etc. supplied from the outside. The image processing unit 110 may output one or more of a vertical sync signal, a horizontal sync signal, and a clock signal in addition to the data enable signal DE. These signals are not shown for convenience of explanation.

The timing controller 120 receives the data signal DATA and driving signals including the data enable signal DE, the vertical sync signal, the horizontal sync signal, the clock signal, etc. from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC received from the timing controller 120 and converts the latched data signal DATA into a gamma reference voltage to output the gamma reference voltage. The data driver 130 outputs the data signal DATA to data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal to gate lines GL1 to GLm. The scan driver 140 may be formed as an IC or formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP configured to display an image.

The subpixels SP may include red subpixels, green subpixels, and blue subpixels, or may include white subpixels, red subpixels, green subpixels, and blue subpixels. Further, one or more of the subpixels SP may have different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first gate line GL1. The driving transistor DR enables a driving current to flow between a power line (or referred to as "high potential power line") EVDD and a cathode power line (or referred to as "low potential power line") EVSS depending on the data voltage stored in the capacitor Cst. The organic light emitting diode OLED emits light with the driving current provided by the driving transistor DR.

The compensation circuit CC is added to the subpixel and compensates for a characteristic including a threshold voltage, etc. of the driving transistor DR. The compensation circuit CC includes one or more transistors. Configuration of the compensation circuit CC may be variously changed in accordance with various embodiments, depending on an external compensation method and is described below with reference to FIG. 3.

As shown in FIG. 3, the compensation circuit CC may include a sensing transistor ST and a sensing line (or referred to as "reference line") VREF. The sensing transistor ST is connected between the sensing line VREF and a node (hereinafter referred to as "sensing node") that is electrically coupled to a source electrode of the driving transistor DR and to an anode electrode of the organic light emitting diode OLED. The sensing transistor ST may supply a sensing voltage (or referred to as "initialization voltage") transmitted through the sensing line VREF to the sensing node of the driving transistor DR, or may sense a voltage or a current of the sensing node of the driving transistor DR or a voltage or a current of the sensing line VREF.

A first electrode of the switching transistor SW is connected to the first data line DL1, and a second electrode of the switching transistor SW is connected to a gate electrode of the driving transistor DR. A first electrode of the driving transistor DR is connected to the power line EVDD, and a second electrode of the driving transistor DR is connected to the anode electrode of the organic light emitting diode OLED. A first electrode of the capacitor Cst is connected to the gate electrode of the driving transistor DR, and a second electrode of the capacitor Cst is connected to the anode electrode of the organic light emitting diode OLED. The anode electrode of the organic light emitting diode OLED is connected to the second electrode of the driving transistor DR, and a cathode electrode of the organic light emitting diode OLED is connected to the power line EVSS. A first electrode of the sensing transistor ST is connected to the sensing line VREF, and a second electrode of the sensing transistor ST is connected to the sensing node, i.e., the anode electrode of the organic light emitting diode OLED and the second electrode of the driving transistor DR.

An operation time of the sensing transistor ST may be similar to (or the same as) or different from an operation time of the switching transistor SW depending on an external compensation algorithm (or depending on a configuration of the compensation circuit). For example, a gate electrode of the switching transistor SW may be connected to a first gate line GL1, and a gate electrode of the sensing transistor ST may be connected to a second gate line GL2. In this instance, a scan signal (Scan) may be transmitted to the first gate line GL1, and a sensing signal (Sense) may be transmitted to the second gate line GL2. As another example, the gate electrode of the switching transistor SW and the gate electrode of the sensing transistor ST may share the first gate line GL1 or the second gate line GL2, and thus the gate electrodes of the switching transistor SW and the sensing transistor ST may be connected.

The sensing line VREF may be connected to the data driver, e.g., the data driver 130 shown in FIG. 1. In this instance, the data driver may sense the sensing node of the subpixel during a non-display period of a real-time image or N frame period and may generate a result of the sensing, where N is an integer equal to or greater than 1. The switching transistor SW and the sensing transistor ST may be turned on at the same time. In such a case, a sensing operation using the sensing line VREF and a data output operation outputting the data signal are separated (or distinguished) from each other in accordance with a time-division driving method of the data driver.

In addition, a compensation target according to the sensing result may be a digital data signal, an analog data signal, a gamma signal, or the like. The compensation circuit for generating a compensation signal (or a compensation voltage) based on the sensing result may be implemented inside the data driver, inside the timing controller, or as a separate circuit.

A light shielding layer LS may be disposed only below a channel region of the driving transistor DR. Alternatively, the light shielding layer LS may be disposed below the channel region of the driving transistor DR and below channel regions of the switching transistor SW and the sensing transistor ST. The light shielding layer LS may be simply used for shielding external light. In addition, the light shielding layer LS may be connected to another electrode or another line and used as an electrode constituting the capacitor, etc. Therefore, the light shielding layer LS may be provided as a multilayer element formed of metal (for example, a multilayer of different metals), so as to have light shielding characteristics.

FIG. 3 illustrates the subpixel having a 3T (Transistor)1C (Capacitor) configuration, including the switching transistor SW, the driving transistor DR, the capacitor Cst, the organic light emitting diode OLED, and the sensing transistor ST, by way of example. However, when the compensation circuit CC is added to the subpixel, the subpixel may have various configurations such as 3T2C, 4T2C, 5T1C, and 6T2C.

As shown in FIG. 4, subpixels are formed on a display area AA of a substrate (or referred to as "thin film transistor substrate") SUB1, and each subpixel may have the circuit structure illustrated in FIG. 3. The subpixels on the display area AA are sealed by a protective film (or referred to as "protective substrate") SUB2. In FIG. 4, a reference numeral "NA" denotes a non-display area of the display panel 150. The substrate SUB1 may be formed of a rigid or semi-rigid material such as glass, or it may be formed of a flexible material.

The subpixels are arranged on a surface of the first substrate SUB1, and may be horizontally or vertically arranged in order of red (R), white (W), blue (B), and green (G) subpixels on the display area AA, depending on an orientation of the first substrate SUB1. The red (R), white (W), blue (B), and green (G) subpixels together form one pixel P. However, embodiments are not limited thereto. For example, the arrangement order of the subpixels may be variously changed depending on a light emitting material, an emission area, configuration (or structure) of the compensation circuit, and the like. Further, the red (R), blue (B), and green (G) subpixels may form one pixel P.

Figure 5:
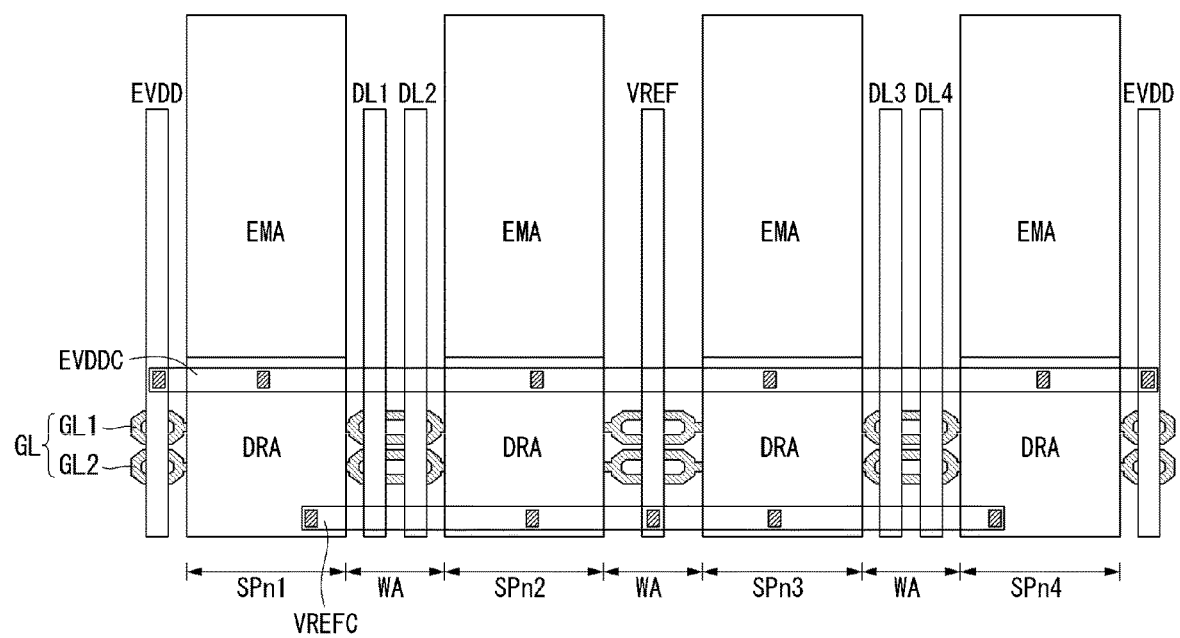
FIG. 5 schematically illustrates a planar layout of subpixels according to an embodiment of the disclosure.
Figure 6:
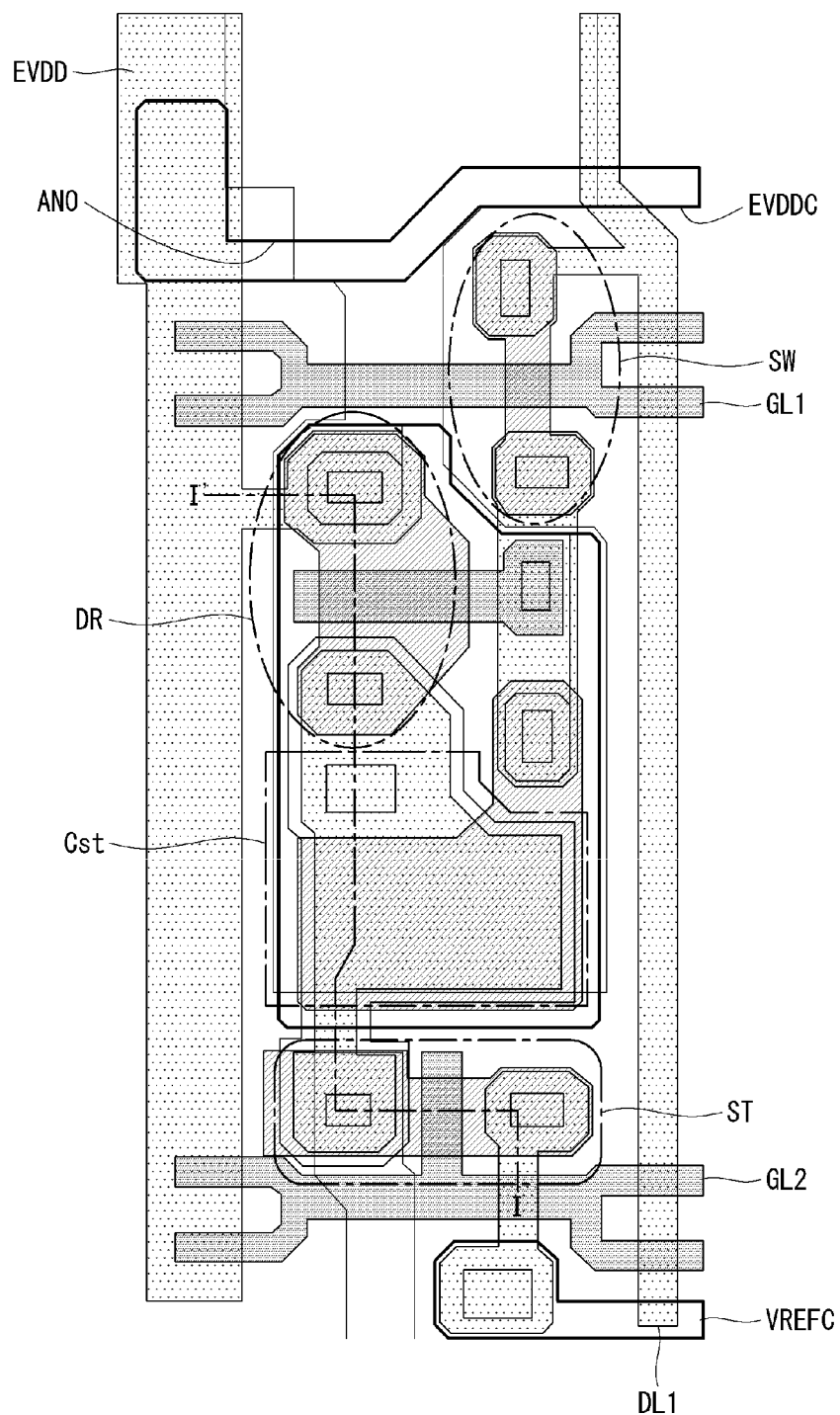
FIG. 6 illustrates in detail a circuit area of FIG. 5 according to an embodiment of the disclosure.
Figure 7:
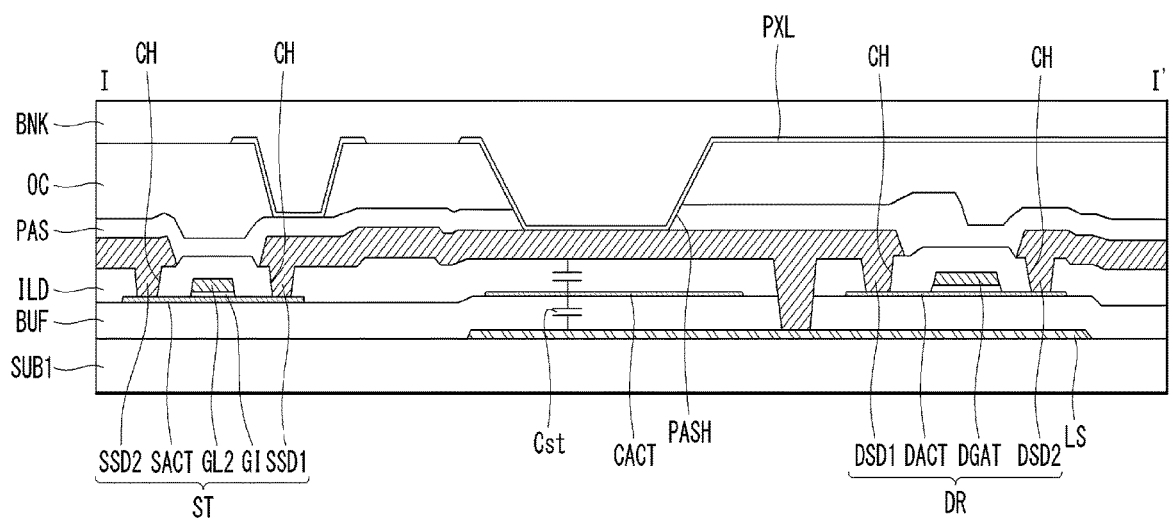
FIG. 7 is a cross-sectional view taken along line I-I' of FIG. 6.

FIG. 5 schematically illustrates a planar layout of subpixels according to an embodiment of the disclosure. FIG. 6 illustrates in detail a circuit area of FIG. 5 according to an embodiment of the disclosure. FIG. 7 is a cross-sectional view taken along line I-I' of FIG. 6.

As shown in FIGS. 4 and 5, first to fourth subpixels SPn1 to SPn4 each having an emission area EMA and a circuit area DRA are formed on the display area AA of the first substrate SUB1. An organic light emitting diode (or a light emitting element) is formed in the emission area EMA, and a circuit including a switching transistor, a sensing transistor, a driving transistor, etc., for driving the organic light emitting diode is formed in the circuit area DRA. In the first to fourth subpixels SPn1 to SPn4, the organic light emitting diode in the emission area EMA emits light according to an operation of the switching transistor and the driving transistor in the circuit area DRA. A line area WA is provided in areas adjacent to sides of each of the first to fourth subpixels SPn1 to SPn4. Namely, the line area WA may be a composite area that includes all of the areas between respective subpixels. A power line EVDD, a sensing line VREF, and first to fourth data lines DL1 to DL4 are disposed in the line area WA. First and second gate lines GL1 and GL2 are disposed across the first to fourth subpixels SPn1 to SPn4.

The signal lines, such as the power line EVDD, the sensing line VREF, and the first to fourth data lines DL1 to DL4, and electrodes constituting a thin film transistor are positioned on different layers, but are electrically connected to each other through contact holes (or via holes). The sensing line VREF is connected to a sensing transistor (not shown) of each of the first to fourth subpixels SPn1 to SPn4 through a sensing connection line VREFC. The power line EVDD is connected to a driving transistor (not shown) of each of the first to fourth subpixels SPn1 to SPn4 through a first power connection line EVDDC. The first and second gate lines GL1 and GL2 are connected to the sensing transistor and the driving transistor of each of the first to fourth subpixels SPn1 to SPn4.

With reference to FIG. 6, a structure of the first subpixel SPn1 is described as an example.

Referring to FIGS. 5 and 6, the first subpixel SPn1 is defined by an intersection of the first and second gate lines GL1 and GL2 and the first data line DL1. The first subpixel SPn1 includes a driving transistor DR, a sensing transistor ST, a switching transistor SW, a capacitor Cst, and an organic light emitting diode OLED.

A first electrode ANO of the organic light emitting diode OLED is disposed in the emission area EMA, and the driving transistor DR, the capacitor Cst, the sensing transistor ST, and the switching transistor SW are disposed in the circuit area DRA. The sensing transistor ST is connected to the sensing connection line VREFC connected from the sensing line VREF shown in FIG. 5.

With reference to FIG. 7, a cross sectional structure of the sensing transistor ST, the driving transistor DR, and the capacitor Cst is described below.

The sensing transistor ST, the capacitor Cst, and the driving transistor DR are disposed on the substrate SUB1. The light shielding layer LS is disposed on the substrate SUB1 and overlaps channels of the capacitor Cst and the driving transistor DR. A buffer layer BUF is disposed on a front surface of the substrate SUB1 including the light shielding layer LS.

The sensing transistor ST including a first semiconductor layer SACT, the second gate line GL2, a first source electrode SSD1, and a first drain electrode SSD2 is disposed on a portion of the buffer layer BUF. A gate insulating layer GI is disposed between the first semiconductor layer SACT and the second gate line GL2 and insulates them. An interlayer dielectric layer ILD is disposed on the second gate line GL2, and the first source electrode SSD1 and the first drain electrode SSD2 are disposed on the interlayer dielectric layer ILD. The interlayer dielectric layer ILD includes contact holes CH exposing a portion of the first semiconductor layer SACT. The first source electrode SSD1 and the first drain electrode SSD2 are in contact with and connected to the first semiconductor layer SACT through the contact holes CH.

A second semiconductor layer DACT, a first gate electrode DGAT, a second source electrode DSD1, and a second drain electrode DSD2 are disposed on another portion of the buffer layer BUF to constitute the driving transistor DR. The gate insulating layer GI is disposed between the second semiconductor layer DACT and the first gate electrode DGAT and insulates them. The interlayer dielectric layer ILD is disposed on the first gate electrode DGAT, and the second source electrode DSD1 and the second drain electrode DSD2 are disposed on the interlayer dielectric layer ILD. The interlayer dielectric layer ILD includes contact holes CH exposing a portion of the second semiconductor layer DACT.

The capacitor Cst is disposed between the sensing transistor ST and the driving transistor DR. The capacitor Cst forms a capacitance as the buffer layer BUF is disposed between the light shielding layer LS and an intermediate electrode CACT. Further, the capacitor Cst forms a capacitance as the interlayer dielectric layer ILD is disposed between the intermediate electrode CACT and the second source electrode DSD1 of the driving transistor DR. Thus, the capacitor Cst serves as a double capacitor.

A passivation layer PAS is disposed on the sensing transistor ST, the driving transistor DR, and the capacitor Cst, and an overcoat layer OC is disposed on the passivation layer PAS to planarize the sensing transistor ST, the driving transistor DR, and the capacitor Cst. A passivation hole PASH is disposed in the overcoat layer OC and the passivation layer PAS to expose the second source electrode DSD1 of the driving transistor DR. A first electrode PXL is disposed on the overcoat layer OC and is connected to the second source electrode DSD1 through the passivation hole PASH. A bank layer BNK for defining a pixel is disposed on the first electrode PXL. Although not shown, an emission layer emitting light and a second electrode are disposed on the bank layer BNK. Thus, the organic light emitting diode including the first electrode PXL, the emission layer, and the second electrode are provided.

The display device having the above-described structure of FIG. 7 requires a total of eleven masks for the light shielding layer, the semiconductor layer, the gate electrode, the contact hole, the source and drain electrodes, the passivation hole (two masks are used), the first electrode, the bank layer, the emission layer, and the second electrode.

Hereinafter, embodiments capable of reducing the number of masks used to manufacture the display device are described.

First Embodiment

Figure 8:
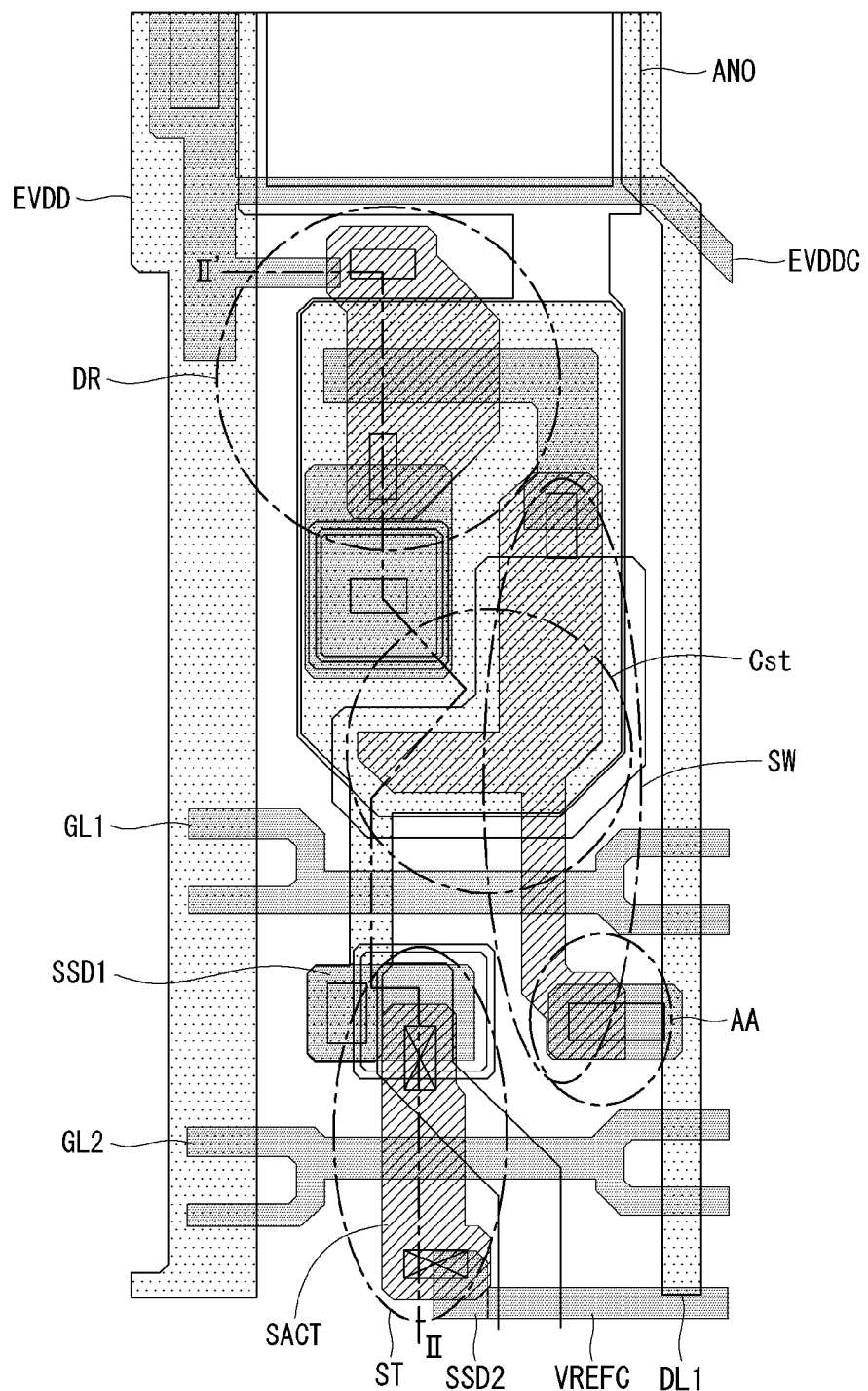
FIG. 8 illustrates a planar structure of a subpixel of a display device according to a first embodiment of the disclosure.
Figure 9:
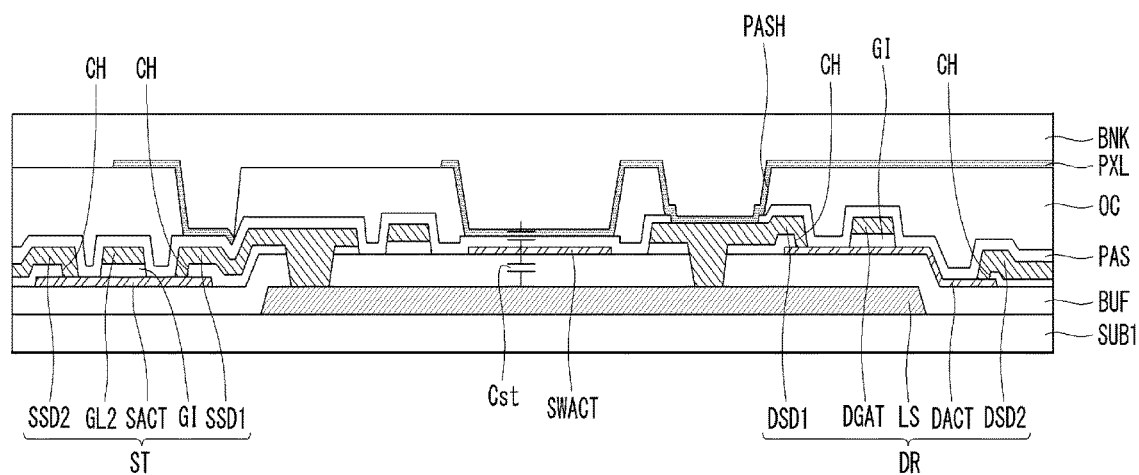
FIG. 9 is a cross-sectional view taken along line II-II' of FIG. 8.

FIG. 8 illustrates a planar structure of a subpixel of a display device according to a first embodiment of the disclosure. FIG. 9 is a cross-sectional view taken along line II-II' of FIG. 8.

Referring to FIGS. 5 and 8, a first subpixel SPn1 is defined by an intersection of first and second gate lines GL1 and GL2 and a first data line DL1. The first subpixel SPn1 includes a driving transistor DR, a sensing transistor ST, a switching transistor SW, a capacitor Cst, and an organic light emitting diode OLED.

A first electrode ANO of the organic light emitting diode OLED is disposed in an emission area EMA of the first subpixel SPn1, and the driving transistor DR, the capacitor Cst, the sensing transistor ST, and the switching transistor SW are disposed in a circuit area DRA of the first subpixel SPn1. For example, the sensing transistor ST includes the second gate line GL2 serving as a gate electrode, a first source electrode SSD1, a first drain electrode SSD2, and a first semiconductor layer SACT. The first drain electrode SSD2 of the sensing transistor ST is formed as one body together with a sensing connection line VREFC connected from a sensing line VREF (see FIG. 5).

In the first subpixel SPn1 shown in FIG. 8, lines arranged in a horizontal direction, for example, the first and second gate lines GL1 and GL2, the sensing connection line VREFC, and a power connection line EVDDC may be formed of a gate electrode material. Further, lines arranged in a vertical direction, for example, the first data line DL1 and a power line EVDD may be formed of a light shielding material.

With reference to FIG. 9, a cross sectional structure of the sensing transistor ST, the driving transistor DR, and the capacitor Cst is described below.

The sensing transistor ST, the capacitor Cst, and the driving transistor DR are disposed on a substrate SUB1. A light shielding layer LS is disposed on the substrate SUB1 and overlaps channels of the capacitor Cst and the driving transistor DR. A buffer layer BUF is disposed on a front surface of the substrate SUB1 including the light shielding layer LS.

The first semiconductor layer SACT, the second gate line GL2, the first source electrode SSD1, and the first drain electrode SSD2 are disposed on a portion of the buffer layer BUF to constitute the sensing transistor ST. A gate insulating layer GI is disposed between the first semiconductor layer SACT and the second gate line GL2 and insulates them. The gate insulating layer GI includes contact holes CH exposing a portion of the first semiconductor layer SACT. The first source electrode SSD1 and the first drain electrode SSD2 are in contact with and connected to the first semiconductor layer SACT through the contact holes CH. The second gate line GL2, the first source electrode SSD1, and the first drain electrode SSD2 are formed of the same material. Namely, the first source electrode SSD1 and the first drain electrode SSD2 are formed using a formation material of the second gate line GL2 at the same time as when the second gate line GL2 is formed.

A second semiconductor layer DACT, a first gate electrode DGAT, a second source electrode DSD1, and a second drain electrode DSD2 are disposed on another portion of the buffer layer BUF to constitute the driving transistor DR. The gate insulating layer GI is disposed between the second semiconductor layer DACT and the first gate electrode DGAT and insulates them. The gate insulating layer GI includes contact holes CH exposing a portion of the second semiconductor layer DACT. The second source electrode DSD1 and the second drain electrode DSD2 are in contact with and connected to the second semiconductor layer DACT through the contact holes CH. Further, the second source electrode DSD1 and the second drain electrode DSD2 directly contact a side surface and an upper surface of the gate insulating layer GI. The first gate electrode DGAT, the second source electrode DSD1, and the second drain electrode DSD2 are formed of the same material in the same manner as the sensing transistor ST.

The capacitor Cst is disposed between the sensing transistor ST and the driving transistor DR. The capacitor Cst forms a capacitance as the buffer layer BUF is disposed between the light shielding layer LS and a third semiconductor layer SWACT of the switching transistor (not shown). Further, the capacitor Cst forms a capacitance as a passivation layer PAS is disposed between the third semiconductor layer SWACT of the switching transistor and a first electrode PXL of the organic light emitting diode. Thus, the capacitor Cst serves as a double capacitor.

The passivation layer PAS is disposed on the sensing transistor ST, the driving transistor DR, and the capacitor Cst. The passivation layer PAS covers the second gate line GL2, the first source electrode SSD1, and the first drain electrode SSD2 and contacts the second semiconductor layer DACT. The contact holes CH of the gate insulating layer GI are not filled with the second source electrode DSD1 and the second drain electrode DSD2 and have an empty area. Hence, the second semiconductor layer DACT is exposed through the contact holes CH. Thus, the passivation layer PAS contacts the second semiconductor layer DACT. An overcoat layer OC is disposed on the passivation layer PAS to planarize the sensing transistor ST, the driving transistor DR, and the capacitor Cst. A passivation hole PASH is disposed in the overcoat layer OC and the passivation layer PAS to expose the second source electrode DSD1 of the driving transistor DR. The first electrode PXL is disposed on the overcoat layer OC and is connected to the second source electrode DSD1 through the passivation hole PASH. A bank layer BNK for defining a pixel is disposed on the first electrode PXL. Although not shown, an emission layer emitting light and a second electrode are disposed on the bank layer BNK. Thus, the organic light emitting diode including the first electrode PXL, the emission layer, and the second electrode are provided.

A method of manufacturing a subpixel according to the embodiment of the disclosure is described below with reference to FIGS. 10A to 10E. FIGS. 10A to 10E are cross-sectional views illustrating respective processes in a method of manufacturing a subpixel of the display device according to the first embodiment of the disclosure. More specifically, FIGS. 10A to 10E illustrate a cross sectional structure different from FIG. 9, so as to show a driving transistor, a capacitor, a pad, and an organic light emitting diode.

Figure 10A:
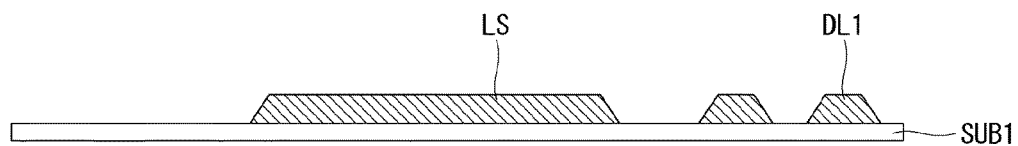
FIGS. 10A to 10E are cross-sectional views illustrating respective processes in a method of manufacturing a subpixel of a display device according to a first embodiment of the disclosure.

Referring to FIG. 10A, a light shielding layer LS and a first data line DL1 are formed on a substrate SUB1 using a first mask. The light shielding layer LS blocks external light from being incident and thus can prevent a light current from being generated in a thin film transistor. The light shielding layer LS and the first data line DL1 are formed of the same material.

Figure 10B:
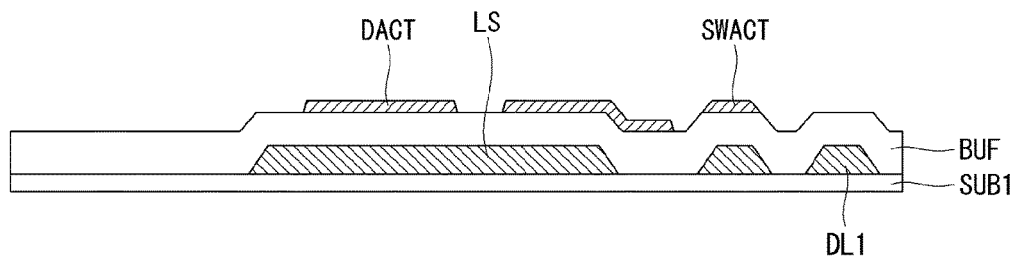

As shown in FIG. 10B, a buffer layer BUF is formed on a front surface of the substrate SUB1 on which the light shielding layer LS is formed. The buffer layer BUF protects a thin film transistor formed in a subsequent process from impurities, for example, alkali ions discharged from the substrate SUB1. The buffer layer BUF may be formed of a silicon oxide (SiOx) layer, a silicon nitride (SiNx) layer, or a multilayer thereof. Subsequently, a second semiconductor layer DACT and a third semiconductor layer SWACT are formed on the buffer layer BUF using a second mask. The second semiconductor layer DACT and the third semiconductor layer SWACT may be formed of an oxide semiconductor.

Figure 10C:
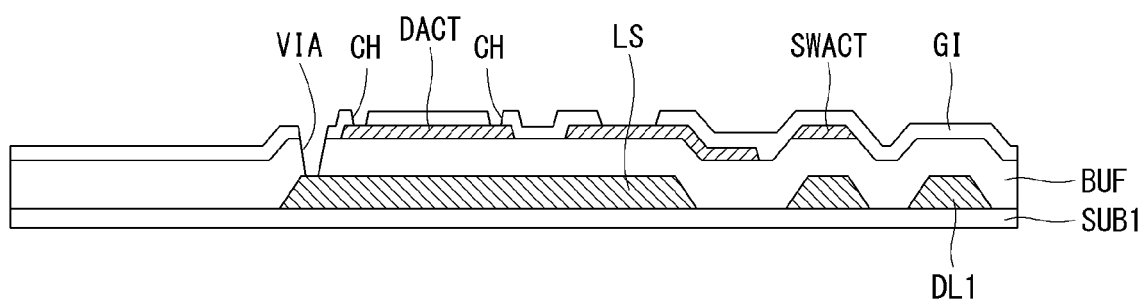

Referring to FIG. 10C, a gate insulating layer GI is deposited on the front surface of the substrate SUB1. Contact holes CH exposing the second semiconductor layer DACT and a via hole VIA exposing the light shielding layer LS are formed using a halftone mask as a third mask. In a dry etching process forming the contact holes CH, impurities are doped on the second semiconductor layer DACT due to plasma to form an ohmic contact.

Figure 10D:
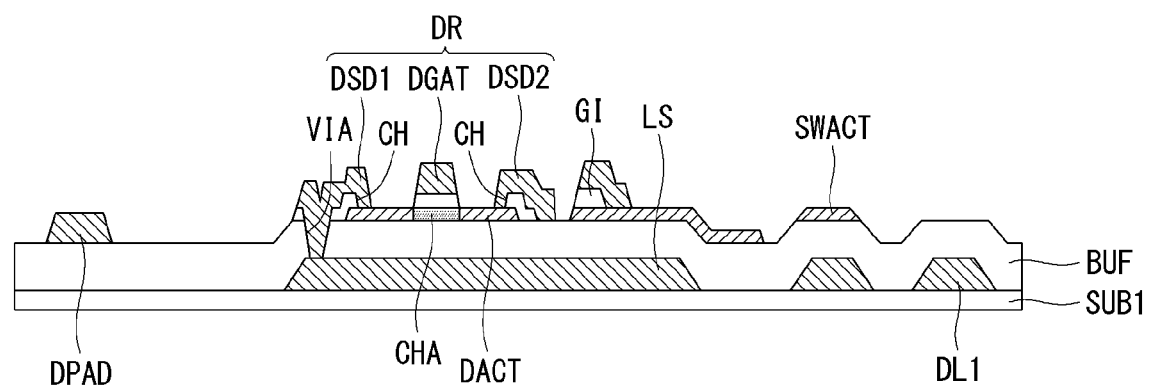

As shown in FIG. 10D, a gate electrode material is deposited on the substrate SUB1, on which the gate insulating layer GI is formed, and then is patterned using a fourth mask to form a second gate electrode DGAT, a second source electrode DSD1, a second drain electrode DSD2, and a data pad DPAD. The gate electrode material may be formed of one of molybdenum (Mo), aluminum (Al), chrome (Cr), gold (Au), titanium (Ti), nickel (Ni), neodymium (Nd), copper (Cu), or a combination thereof. Further, the gate electrode material may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode material may be formed as a double layer of Mo/Al—Nd or Mo/Al.

The second source electrode DSD1 and the second drain electrode DSD2 contact the second semiconductor layer DACT through the contact holes CH of the gate insulating layer GI, and the second source electrode DSD1 contacts the light shielding layer LS through the via hole VIA.

Next, the gate insulating layer GI is dry etched using the second gate electrode DGAT as a mask so that a size of the gate insulating layer GI underlying the second gate electrode DGAT is the same as a size of the second gate electrode DGAT. Hence, a channel CHA corresponding to the second gate electrode DGAT is formed in the second semiconductor layer DACT, and an area of the contact holes CH exposing the second semiconductor layer DACT increases. As a result, a driving transistor DR and a data pad DPAD are formed on the substrate SUB1.

Figure 10E:
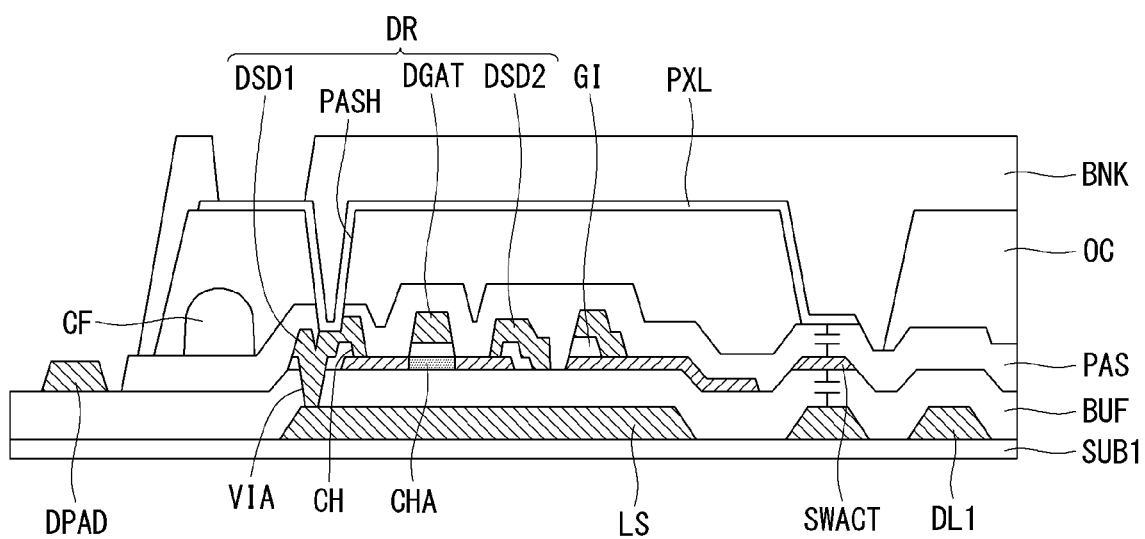

Referring to FIG. 10E, a passivation layer PAS is deposited on the substrate SUB1, on which the driving transistor DR and the data pad DPAD are formed, and a passivation hole PASH is formed in the passivation layer PAS using a fifth mask. The passivation layer PAS contacts the second semiconductor layer DACT through the contact holes CH. A color filter CF is formed, and then an overcoat layer OC is formed. The overcoat layer OC may be a planarization layer for reducing a height difference (or step coverage) of an underlying structure and may be formed of an organic material such as polyimide, benzocyclobutene-based resin, and acrylate. A passivation hole PASH exposing the second source electrode DSD1 is formed in a portion of the overcoat layer OC using a sixth mask.

A first electrode PXL is formed on the overcoat layer OC using a seventh mask. The first electrode PXL is connected to the second source electrode DSD1 of the driving transistor DR through the passivation hole PASH. Further, a portion of the first electrode PXL and the third semiconductor layer SWACT of a switching transistor serve as a capacitor Cst. A bank layer BNK is formed on the first electrode PXL, and an opening (not shown) of a subpixel is formed using an eighth mask. Although not shown, an emission layer is formed on the bank layer BNK using a ninth mask, and a second electrode is formed using a tenth mask.

As described above, the display device according to the first embodiment of the disclosure is manufactured using a total of ten masks. Therefore, the embodiment of the disclosure can reduce the number of masks by one, compared to the display device shown in FIG. 7.

Figure 11:
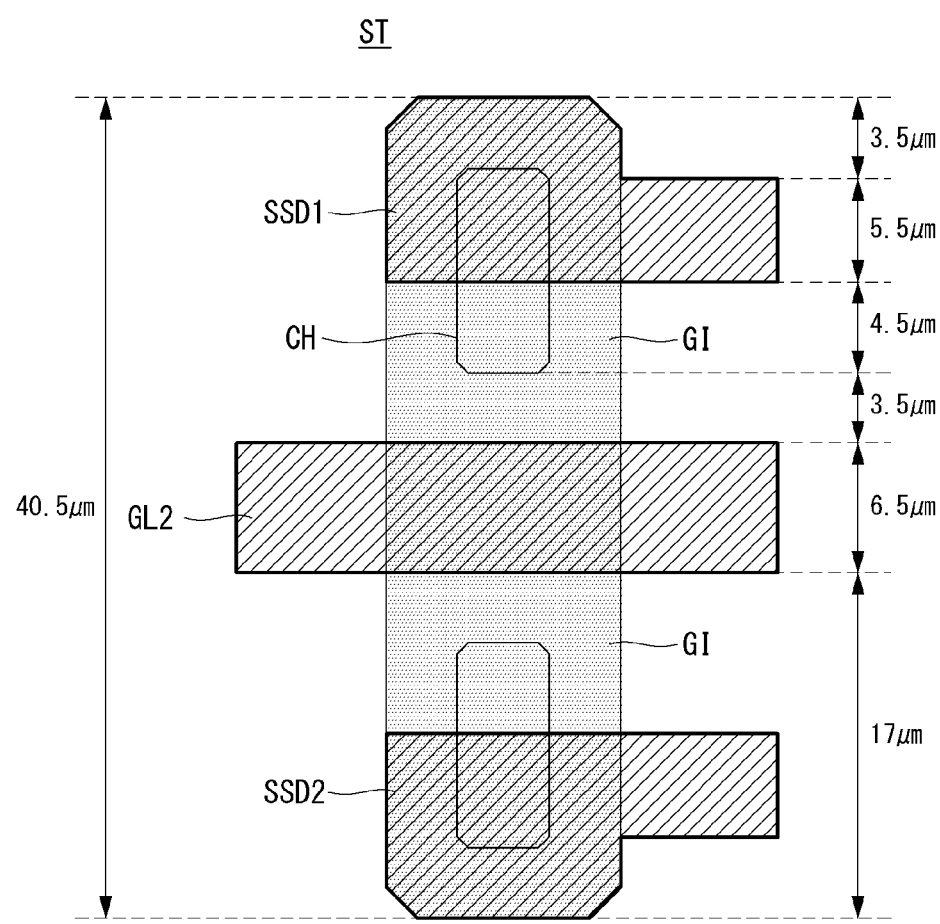
FIG. 11 is a plan view of a sensing transistor according to an embodiment of the disclosure.

The thin film transistors of the display device according to the first embodiment of the disclosure each have a predetermined size. The sensing transistor of the subpixel shown in FIG. 9 is described as an example below. FIG. 11 is a plan view of a sensing transistor according to an embodiment of the disclosure.

Referring to FIG. 11, the sensing transistor ST includes a first semiconductor layer SACT, a gate insulating layer GI that is positioned on the first semiconductor layer SACT and includes contact holes CH exposing a portion of the first semiconductor layer SACT, a second gate line GL2 positioned on the gate insulating layer GI, and a first source electrode SSD1 and a first drain electrode SSD2 that are positioned on the gate insulating layer GI and contact the first semiconductor layer SACT through the contact holes CH.

As shown in FIG. 11, a length of each of the contact holes CH may be about 10 μm, so that the first source electrode SSD1 and the first drain electrode SSD2 each contact the contact holes CH. Each contact hole CH may be spaced from the second gate line GL2 by about 3.5 μm depending on a patterning margin between the contact hole CH and the second gate line GL2. A width of the second gate line GL2 may be about 6.5 μm. Thus, a total length of the sensing transistor ST may be about 40.5 μm.

Hereinafter, a display device according to a second embodiment of the disclosure capable of reducing a length (i.e., a size) of thin film transistors is described.

Second Embodiment

Figure 12:
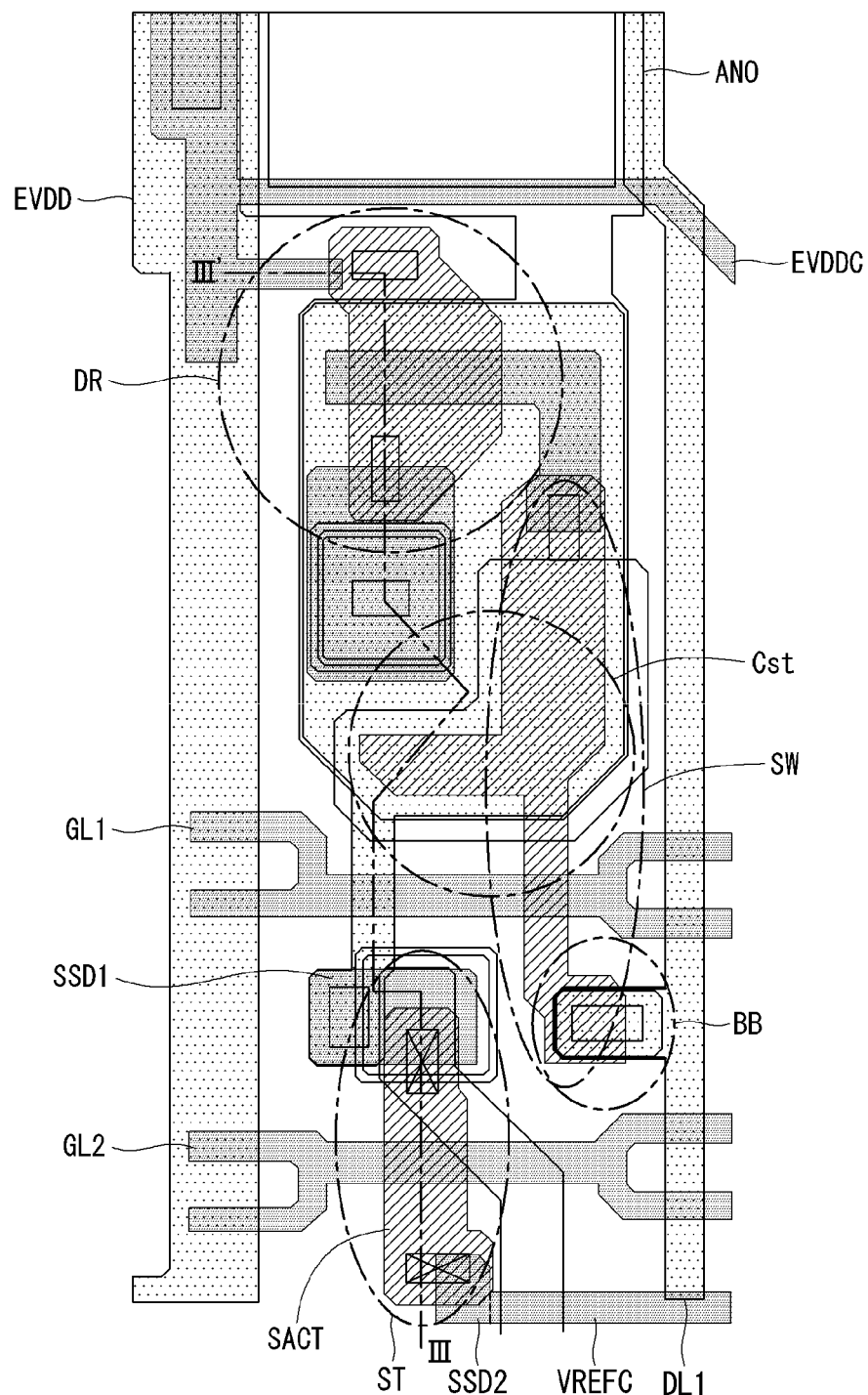
FIG. 12 is a plan view of a subpixel according to a second embodiment of the disclosure.
Figure 13:
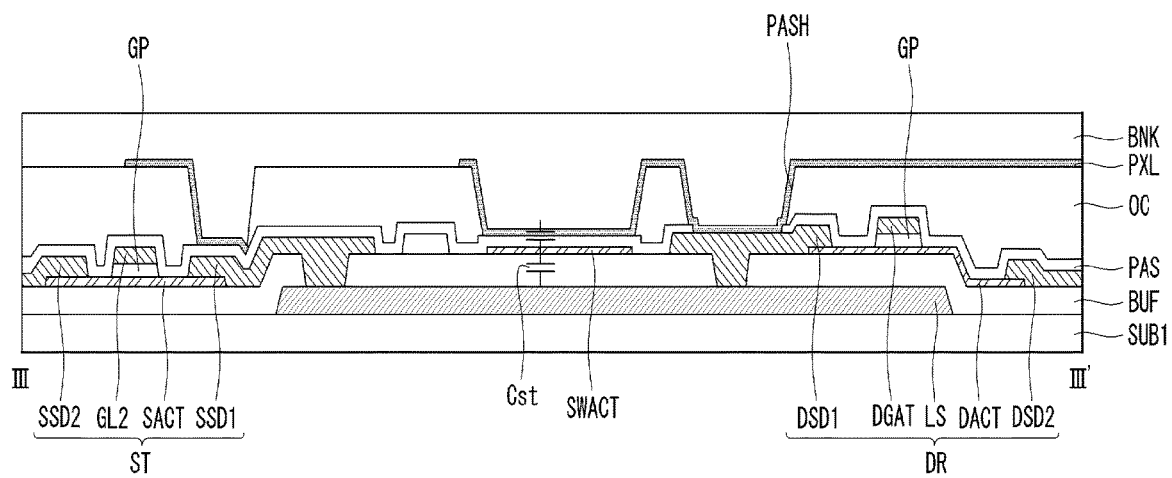
FIG. 13 is a cross-sectional view taken along line of FIG. 12.
Figure 14:
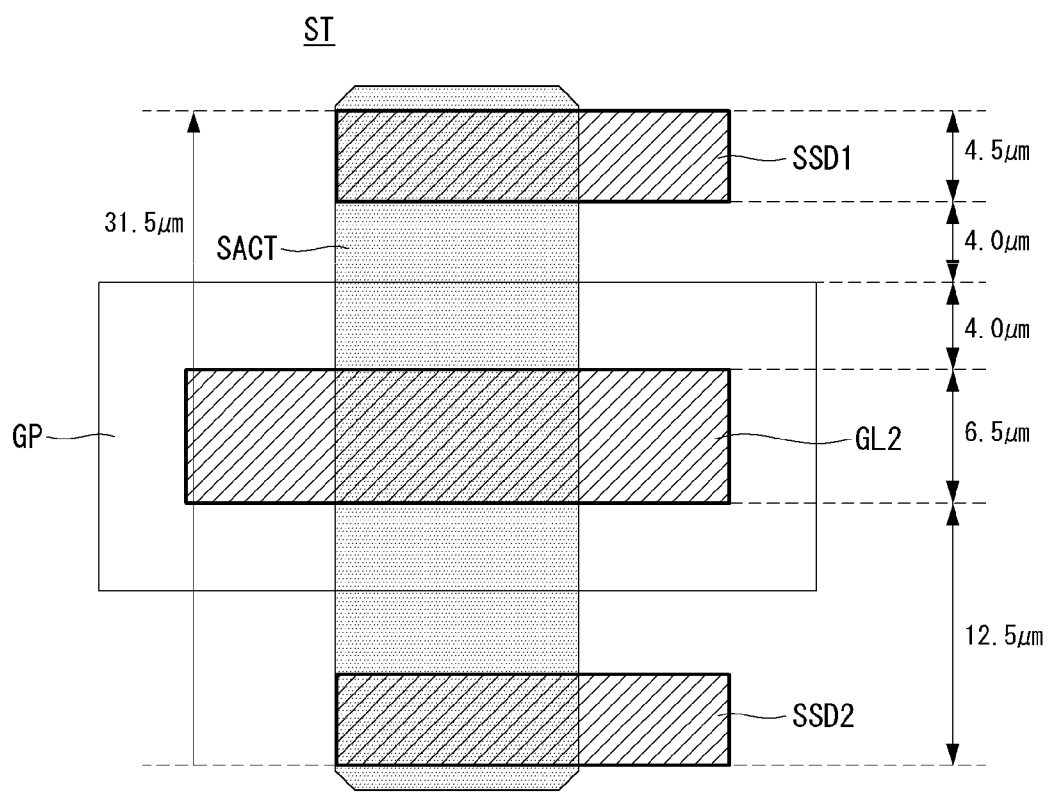
FIG. 14 is a plan view of a sensing transistor according to a second embodiment of the disclosure.

FIG. 12 is a plan view of a subpixel according to a second embodiment of the disclosure. FIG. 13 is a cross-sectional view taken along line of FIG. 12. FIG. 14 is a plan view of a sensing transistor according to the second embodiment of the disclosure.

Referring to FIG. 12, a first subpixel SPn1 is defined by an intersection of first and second gate lines GL1 and GL2 and a first data line DL1. The first subpixel SPn1 includes a driving transistor DR, a sensing transistor ST, a switching transistor SW, a capacitor Cst, and an organic light emitting diode OLED.

A first electrode ANO of the organic light emitting diode OLED is disposed in an emission area EMA of the first subpixel SPn1, and the driving transistor DR, the capacitor Cst, the sensing transistor ST, and the switching transistor SW are disposed in a circuit area DRA of the first subpixel SPn1. For example, the sensing transistor ST includes the second gate line GL2 serving as a gate electrode, a first source electrode SSD1, a first drain electrode SSD2, and a first semiconductor layer SACT. The first drain electrode SSD2 of the sensing transistor ST is formed as one body together with a sensing connection line VREFC connected from a sensing line VREF (see FIG. 5).

In the first subpixel SPn1 shown in FIG. 12, lines arranged in a horizontal direction, for example, the first and second gate lines GL1 and GL2, the sensing connection line VREFC, and a power connection line EVDDC may be formed of a gate electrode material. Further, lines arranged in a vertical direction, for example, the first data line DL1 and a power line EVDD may be formed of a light shielding material.

With reference to FIG. 13, a cross sectional structure of the sensing transistor ST, the driving transistor DR, and the capacitor Cst is described below.

The sensing transistor ST, the capacitor Cst, and the driving transistor DR are disposed on a substrate SUB1. A light shielding layer LS is disposed on the substrate SUB1 and overlaps channels of the capacitor Cst and the driving transistor DR. A buffer layer BUF is disposed on a front surface of the substrate SUB1 including the light shielding layer LS.

The sensing transistor ST including a first semiconductor layer SACT, the second gate line GL2, a first source electrode SSD1, and a first drain electrode SSD2 is disposed on a portion of the buffer layer BUF.

In the embodiment of the disclosure, a gate insulating pattern GP is disposed between the first semiconductor layer SACT and the second gate line GL2 and insulates them. The gate insulating pattern GP is formed larger than the second gate line GL2 adjacent to the first semiconductor layer SACT to thereby secure an insulating margin of the second gate line GL2. More specifically, the gate insulating pattern GP is disposed only between the first semiconductor layer SACT and the second gate line GL2 of the sensing transistor ST and is not disposed in a remaining area of the sensing transistor ST. Thus, the first source electrode SSD1 and the first drain electrode SSD2 are in direct contact with and connected to both sides of the first semiconductor layer SACT, respectively. Namely, no structure like a gate insulating layer is disposed between the first source electrode SSD1 and the first semiconductor layer SACT and between the first drain electrode SSD2 and the first semiconductor layer SACT.

The second gate line GL2, the first source electrode SSD1, and the first drain electrode SSD2 may be formed of the same material. Namely, the first source electrode SSD1 and the first drain electrode SSD2 are formed using a formation material of the second gate line GL2 at the same time as when the second gate line GL2 is formed.

The driving transistor DR including a second semiconductor layer DACT, a first gate electrode DGAT, a second source electrode DSD1, and a second drain electrode DSD2 are disposed on another portion of the buffer layer BUF.

In the same manner as the sensing transistor ST, a gate insulating pattern GP is disposed between the second semiconductor layer DACT and the first gate electrode DGAT of the driving transistor DR. More specifically, the gate insulating pattern GP is disposed only between the second semiconductor layer DACT and the first gate electrode DGAT of the driving transistor DR and is not disposed in a remaining area of the driving transistor DR. Thus, the second source electrode DSD1 and the second drain electrode DSD2 are in direct contact with and connected to both sides of the second semiconductor layer DACT, respectively. Namely, no structure like the gate insulating layer is disposed between the second source electrode DSD1 and the second semiconductor layer DACT and between the second drain electrode DSD2 and the second semiconductor layer DACT. Further, in the same manner as the sensing transistor ST, the first gate electrode DGAT, the second source electrode DSD1, and the second drain electrode DSD2 may be formed of the same material.

The capacitor Cst is disposed between the sensing transistor ST and the driving transistor DR. The capacitor Cst forms a capacitance as the buffer layer BUF is disposed between the light shielding layer LS and a third semiconductor layer SWACT of the switching transistor (not shown). Further, the capacitor Cst forms a capacitance as a passivation layer PAS is disposed between the third semiconductor layer SWACT of the switching transistor and a first electrode PXL of the organic light emitting diode. Thus, the capacitor Cst serves as a double capacitor.

The passivation layer PAS is disposed on the sensing transistor ST, the driving transistor DR, and the capacitor Cst, and an overcoat layer OC is disposed on the passivation layer PAS to planarize the sensing transistor ST, the driving transistor DR, and the capacitor Cst. A passivation hole PASH is disposed in the overcoat layer OC and the passivation layer PAS to expose the second source electrode DSD1 of the driving transistor DR. The first electrode PXL is disposed on the overcoat layer OC and is connected to the second source electrode DSD1 through the passivation hole PASH. A bank layer BNK for defining a pixel is disposed on the first electrode PXL. Although not shown, an emission layer emitting light and a second electrode are disposed on the bank layer BNK. Thus, the organic light emitting diode including the first electrode PXL, the emission layer, and the second electrode are provided.

Thin film transistors used as the sensing transistor, the driving transistor, and the switching transistor each have a predetermined size. The sensing transistor is described as an example below. FIG. 14 is a plan view of the sensing transistor according to the second embodiment of the disclosure.

Referring to FIG. 14, the sensing transistor ST includes a first semiconductor layer SACT, a gate insulating pattern GP that is positioned on the first semiconductor layer SACT and overlaps a second gate line GL2, the second gate line GL2 positioned on the gate insulating pattern GP, and a first source electrode SSD1 and a first drain electrode SSD2 that directly contact both sides of the first semiconductor layer SACT, respectively.

An overlap area between the first source electrode SSD1 and the first semiconductor layer SACT and an overlap area between the first drain electrode SSD2 and the first semiconductor layer SACT each entirely contact the first semiconductor layer SACT. The configuration of the first source electrode SSD1 and the first drain electrode SSD2 can be performed because no structure like the gate insulating layer is disposed between the first source electrode SSD1 and the first semiconductor layer SACT and between the first drain electrode SSD2 and the first semiconductor layer SACT. Thus, a contact area between the first source electrode SSD1 and the first semiconductor layer SACT and a contact area between the first drain electrode SSD2 and the first semiconductor layer SACT can greatly increase. An increase in the contact area can result in securing a contact resistance and in improving characteristics of the thin film transistors. In addition, because the first source electrode SSD1 and the first drain electrode SSD2 are spaced from the gate insulating pattern GP, a contact area between the first source electrode SSD1 or the first drain electrode SSD2 and the first semiconductor layer SACT can be secured.

As shown in FIG. 14, a width of the second gate line GL2 may be about 6.5 μm. The gate insulating pattern GP is extended from at least one side of the second gate line GL2 by about 4 μm and is formed larger than the second gate line GL2, in order to secure a margin for insulating the second gate line GL2 from the first semiconductor layer SACT. Further, each of the first source electrode SSD1 and the first drain electrode SSD2 is spaced from one side of the gate insulating pattern GP by about 4 μm, in order to directly contact the first semiconductor layer SACT. Thus, a length of the sensing transistor ST may be about 31.5 μm.

Compared with the first embodiment of the disclosure illustrated in FIG. 11, the length of the thin film transistor in the second embodiment of the disclosure can decrease from about 40.5 μm to about 31.5 μm by about 22%. Further, the contact area between the semiconductor layer and the source electrode or the drain electrode through the contact hole in the second embodiment of the disclosure can increase from (4.5 μm×5.5 μm) to (4.5 μm×11.5 μm) by about 109%.

Figure 15:
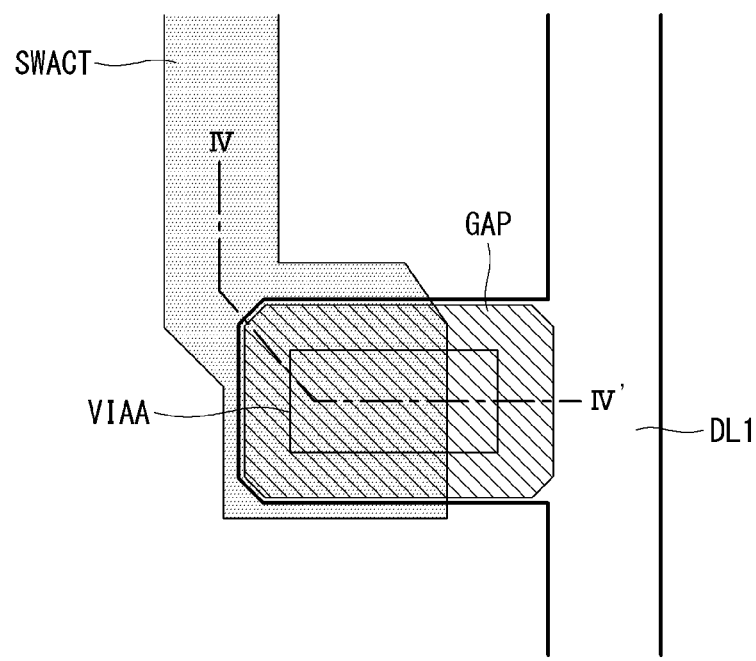
FIG. 15 is an enlarged view of an area AA shown in FIG. 8.
Figure 16:
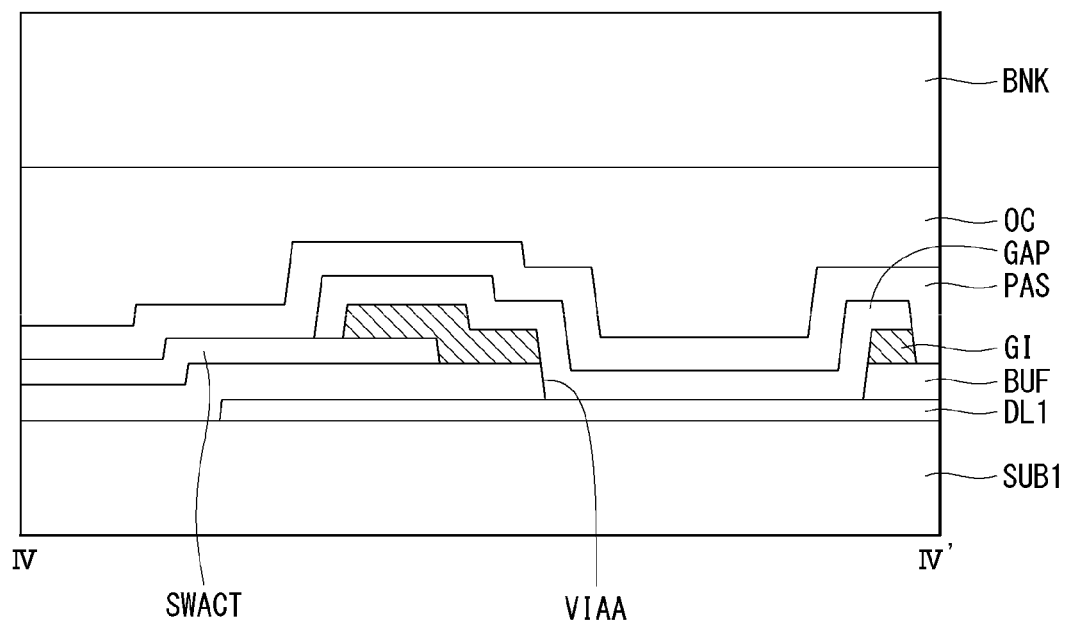
FIG. 16 is a cross-sectional view taken along line IV-IV' of FIG. 15.
Figure 17:
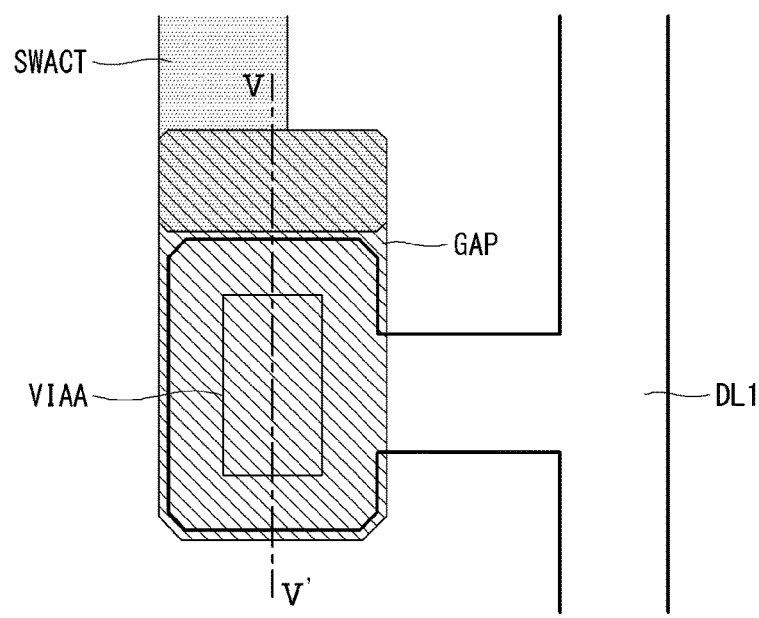
FIG. 17 is an enlarged view of an area BB shown in FIG. 12.
Figure 18:
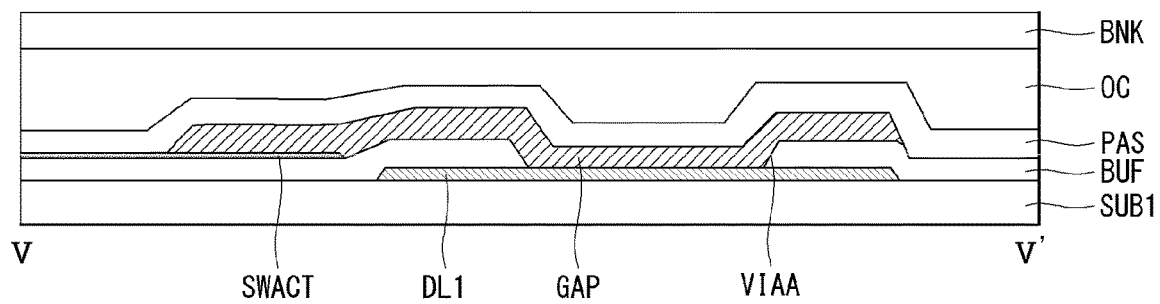
FIG. 18 is a cross-sectional view taken along line V-V' of FIG. 17.
Figure 19:
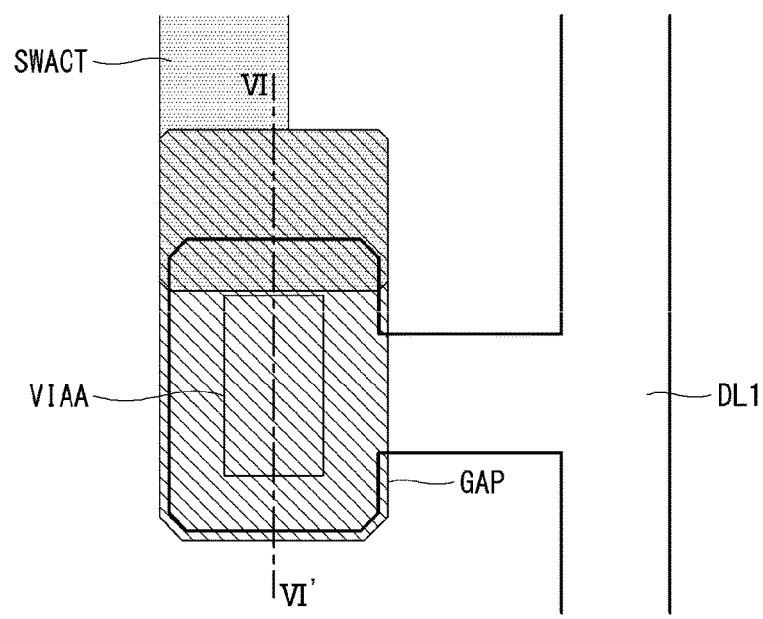
FIG. 19 illustrates another structure of an area BB shown in FIG. 12.
Figure 20:
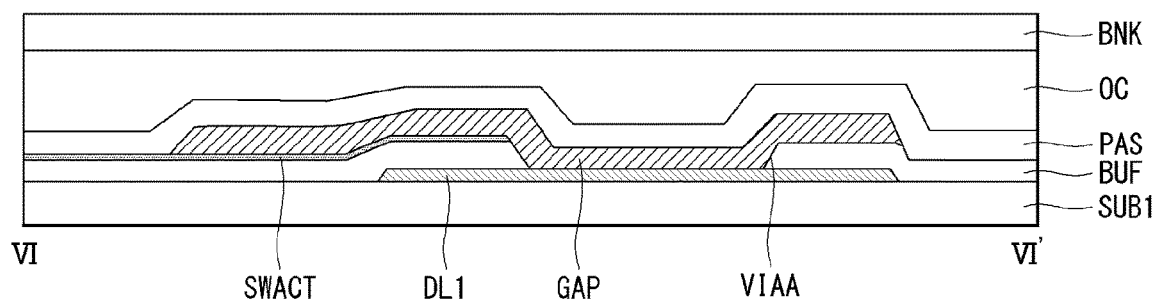
FIG. 20 is a cross-sectional view taken along line VI-VI' of FIG. 19.

FIG. 15 is an enlarged view of an area AA shown in FIG. 8. FIG. 16 is a cross-sectional view taken along line IV-IV' of FIG. 15. FIG. 17 is an enlarged view of an area BB shown in FIG. 12. FIG. 18 is a cross-sectional view taken along line V-V' of FIG. 17. FIG. 19 illustrates another structure of an area BB shown in FIG. 12. FIG. 20 is a cross-sectional view taken along line VI-VI' of FIG. 19.

Referring to FIGS. 15 and 16, the first data line DL1 formed of a light shielding material is disposed on the substrate SUB1, and the buffer layer BUF is disposed on the first data line DL1. The third semiconductor layer SWACT of the switching transistor is disposed on the buffer layer BUF, and the gate insulating layer GI is disposed on the third semiconductor layer SWACT and the buffer layer BUF. A gate pattern GAP is disposed on the gate insulating layer GI. One side of the gate pattern GAP contacts the first data line DL1 through the buffer layer BUF and a through hole VIAA of the gate insulating layer GI, and the other side of the gate pattern GAP contacts the third semiconductor layer SWACT.

The passivation layer PAS, the overcoat layer OC, and the bank layer BNK are sequentially disposed on the gate pattern GAP. However, in the structure illustrated in FIGS. 15 and 16, because a contact area between the gate pattern GAP and the third semiconductor layer SWACT is very small, a contact resistance increases to thereby generate a contact failure.

The second embodiment of the disclosure can improve the contact area between the gate pattern GAP and the third semiconductor layer SWACT.

More specifically, referring to FIGS. 17 and 18, the first data line DL1 formed of a light shielding material is disposed on the substrate SUB1, and the buffer layer BUF is disposed on the first data line DL1. The third semiconductor layer SWACT of the switching transistor is disposed on the buffer layer BUF, and a gate pattern GAP is disposed on the third semiconductor layer SWACT and the buffer layer BUF. One side of the gate pattern GAP contacts the first data line DL1 through a through hole VIAA of the buffer layer BUF, and the other side of the gate pattern GAP contacts the third semiconductor layer SWACT through the through hole VIAA of the buffer layer BUF.

In the second embodiment of the disclosure, a gate insulating pattern is disposed only between the gate electrodes and the semiconductor layers of the driving, switching, and sensing transistors, and a structure like the gate insulating layer is removed in all of the area except a formation area of the gate insulating pattern. Thus, because the structure like the gate insulating layer is removed even in a contact area between the gate pattern GAP and the first data line DL1, a contact area between the gate pattern GAP and the third semiconductor layer SWACT can increase.

As another example, referring to FIGS. 19 and 20, a contact area between the gate pattern GAP and the third semiconductor layer SWACT can further increase by further increasing a length of the third semiconductor layer SWACT.

A method of manufacturing a subpixel according to the embodiment of the disclosure is described below with reference to FIGS. 21A to 21G. FIGS. 21A to 21G are cross-sectional views illustrating respective processes in a method of manufacturing a subpixel of a display device according to an embodiment of the disclosure. More specifically, FIGS. 21A to 21G illustrate a cross sectional structure different from FIG. 13, so as to show a driving transistor, a capacitor, a pad, and an organic light emitting diode.

Figure 21A:
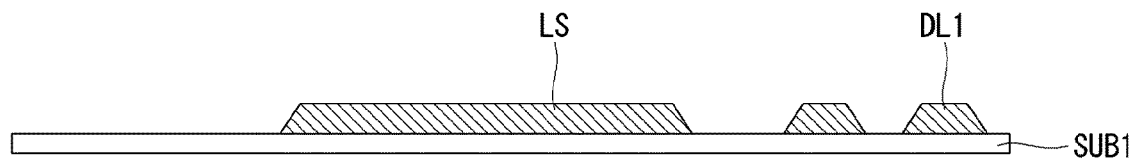
FIGS. 21A to 21G are cross-sectional views illustrating respective processes in a method of manufacturing a subpixel of a display device according to an embodiment of the disclosure.

Referring to FIG. 21A, a light shielding layer LS and a first data line DL1 are formed on a substrate SUB1 using a first mask. The light shielding layer LS blocks external light from being incident and thus can prevent a light current from being generated in a thin film transistor. The light shielding layer LS and the first data line DL1 are formed of the same material.

Figure 21B:
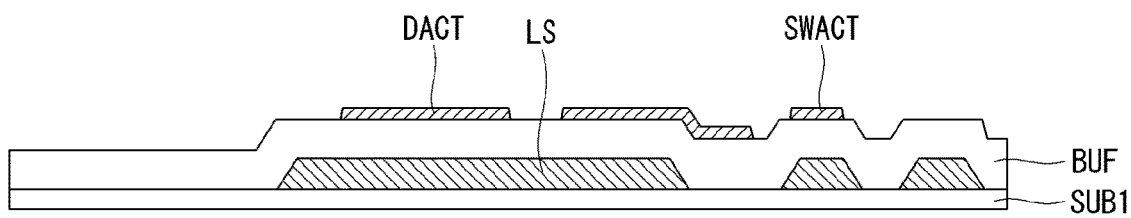

As shown in FIG. 21B, a buffer layer BUF is formed on a front surface of the substrate SUB1 on which the light shielding layer LS is formed. The buffer layer BUF protects a thin film transistor formed in a subsequent process from impurities, for example, alkali ions discharged from the substrate SUB1. The buffer layer BUF may be formed of a silicon oxide (SiOx) layer, a silicon nitride (SiNx) layer, or a multilayer thereof. Subsequently, a second semiconductor layer DACT and a third semiconductor layer SWACT are formed on the buffer layer BUF using a second mask. The second semiconductor layer DACT and the third semiconductor layer SWACT may be formed of an oxide semiconductor.

Figure 21C:
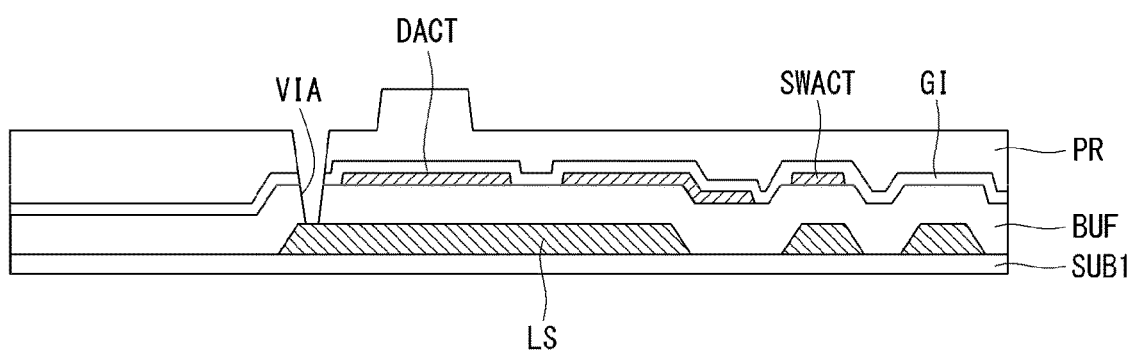

Referring to FIG. 21C, a gate insulating layer GI is deposited on the front surface of the substrate SUB1. A photoresist PR is formed using a halftone mask as a third mask. A via hole VIA exposing the light shielding layer LS is formed using the photoresist PR.

Figure 21D:
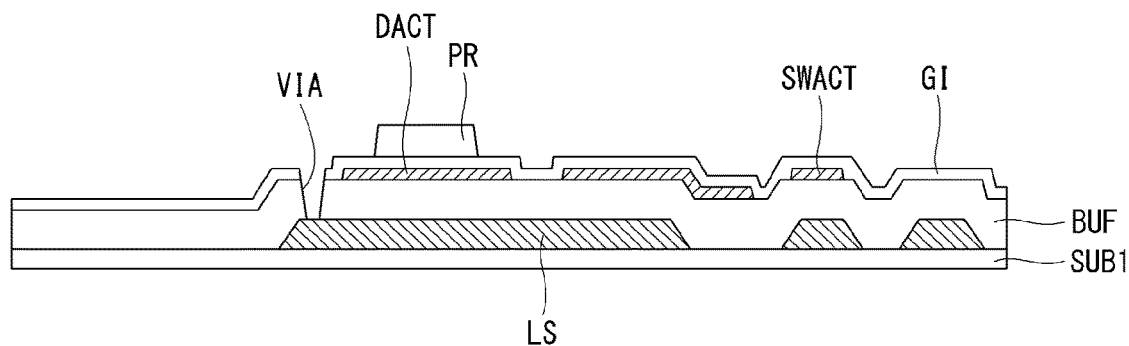

Referring to FIG. 21D, an ashing process is performed on the photoresist PR to remain the photoresist PR only in an area corresponding to a channel of the second semiconductor layer DACT and to remove the photoresist PR except the photoresist PR remaining in the corresponding area. The ashing process is equally performed on other transistors as well as the sensing transistor, that is described as an example, in order to remove the photoresist PR from the entire surface of the substrate SUB1.

Figure 21E:
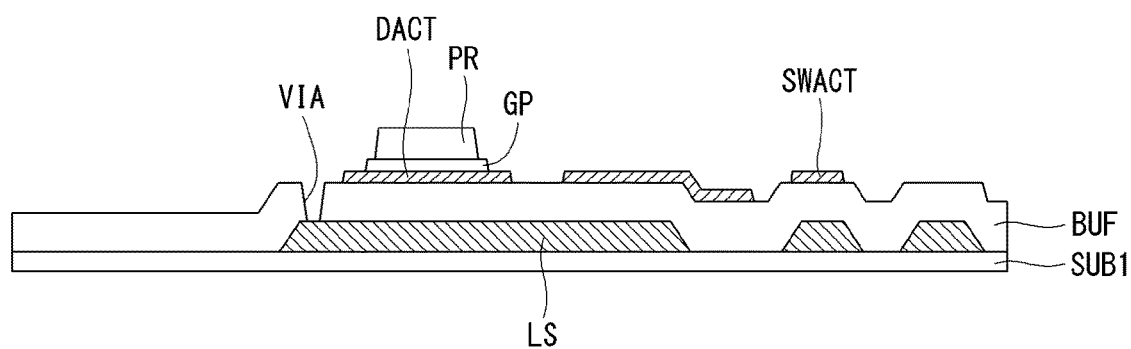

Referring to FIG. 21E, the gate insulating layer GI remains only in an area corresponding to the channel of the second semiconductor layer DACT using the remaining photoresist PR, and other gate insulating layer GI is removed. Hence, a gate insulating pattern GP is formed. Subsequently, the remaining photoresist PR is completely removed.

Figure 21F:
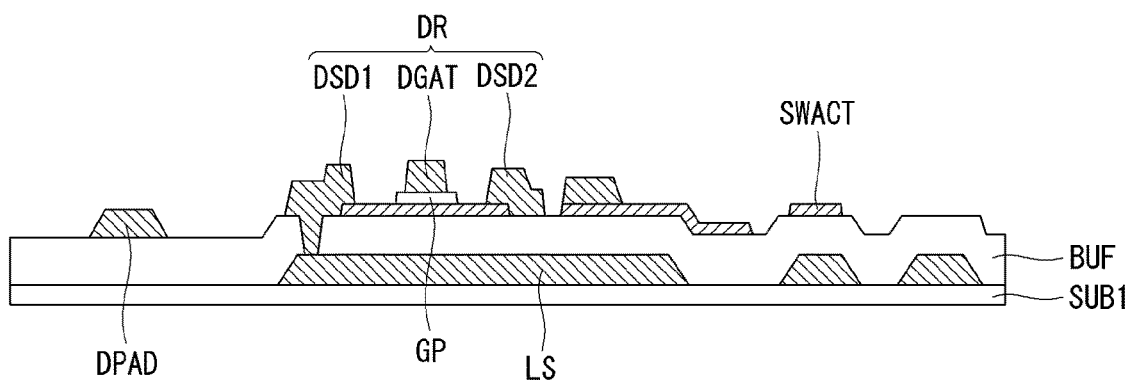

As shown in FIG. 21F, a gate electrode material is deposited on the substrate SUB1, on which the gate insulating pattern GP is formed, and then is patterned using a fourth mask to form a second gate electrode DGAT, a second source electrode DSD1, a second drain electrode DSD2, and a data pad DPAD. The gate electrode material may be formed of one of molybdenum (Mo), aluminum (Al), chrome (Cr), gold (Au), titanium (Ti), nickel (Ni), neodymium (Nd), copper (Cu), or a combination thereof. Further, the gate electrode material may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode material may be formed as a double layer of Mo/Al—Nd or Mo/Al.

Each of the second source electrode DSD1 and the second drain electrode DSD2 directly contacts the second semiconductor layer DACT, and the second source electrode DSD1 contacts the light shielding layer LS through the via hole VIA.

Next, the gate insulating pattern GP is dry etched using the second gate electrode DGAT as a mask so that a size of the gate insulating pattern GP underlying the second gate electrode DGAT is the same as a size of the second gate electrode DGAT. Hence, a channel CHA corresponding to the second gate electrode DGAT is formed in the second semiconductor layer DACT. As a result, a driving transistor DR and a data pad DPAD are formed on the substrate SUB1.

Figure 21G:
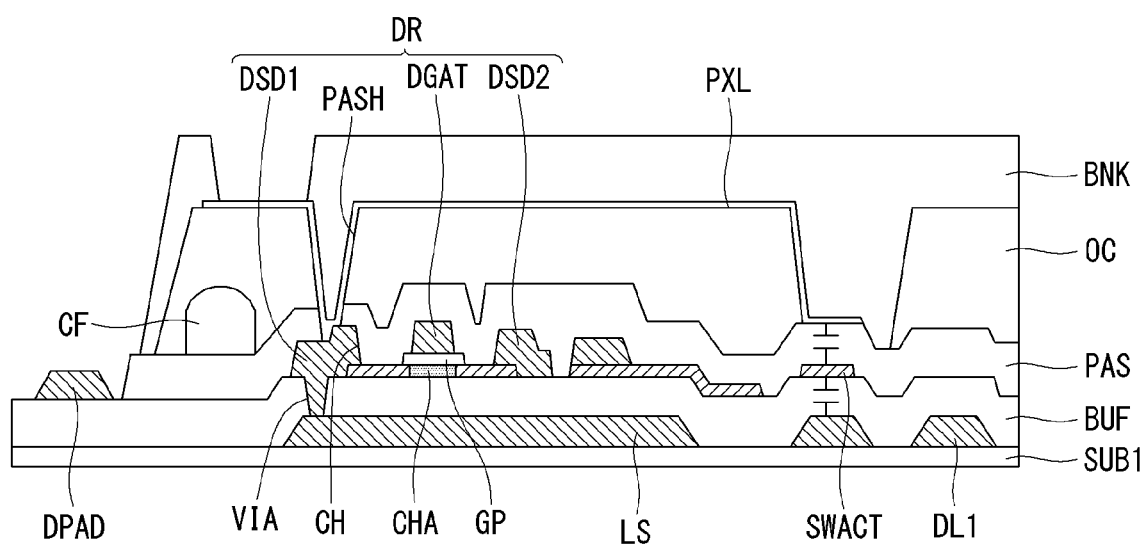

Referring to FIG. 21G, a passivation layer PAS is deposited on the substrate SUB1, on which the driving transistor DR and the data pad DPAD are formed, and a passivation hole PASH is formed in the passivation layer PAS using a fifth mask. A color filter CF is formed, and then an overcoat layer OC is formed. A passivation hole PASH exposing the second source electrode DSD1 is formed in a portion of the overcoat layer OC using a sixth mask.

A first electrode PXL is formed on the overcoat layer OC using a seventh mask. The first electrode PXL is connected to the second source electrode DSD1 of the driving transistor DR through the passivation hole PASH. Further, a portion of the first electrode PXL and the third semiconductor layer SWACT of a switching transistor serve as a capacitor Cst. A bank layer BNK is formed on the first electrode PXL, and an opening (not shown) of a subpixel is formed using an eighth mask. Although not shown, an emission layer is formed on the bank layer BNK using a ninth mask, and a second electrode is formed using a tenth mask.

The display device according to the second embodiment of the disclosure is manufactured using a total of ten masks as described above. Therefore, the embodiment of the disclosure can reduce the number of masks by one, compared to the display device shown in FIG. 7.

As described above, the embodiments of the disclosure can reduce the number of the masks and improve the productivity of the display device by forming the gate electrode, the source electrode, and the drain electrode using one mask.

Further, the embodiments of the disclosure can increase a contact area between the semiconductor layer and the source electrode and a contact area between the semiconductor layer and the drain electrode by forming the gate insulating pattern only between the gate electrode and the semiconductor layer. Thus, the embodiments of the disclosure can reduce a contact resistance between the semiconductor layer and the source electrode and a contact resistance between the semiconductor layer and the drain electrode and improve characteristics of the thin film transistors.

Further, the embodiments of the disclosure can remove the contact hole because the gate insulating pattern is formed only between the gate electrode and the semiconductor layer, thereby reducing the size of the thin film transistor by the size of the removed contact hole. Hence, the embodiments of the disclosure can increase an aperture ratio of the subpixel by a reduction in the size of the thin film transistor.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a substrate;
a buffer layer disposed on the substrate;
a first semiconductor layer of a first thin film transistor disposed on the buffer layer;
a gate insulating layer disposed on a channel region of the first semiconductor layer, on a source region of the first semiconductor layer, and on a drain region of the first semiconductor layer;
a first gate electrode disposed on the gate insulating layer over the channel region of the first semiconductor layer;
a first source electrode in direct contact with the source region of the first semiconductor layer, wherein the first source electrode is disposed on the gate insulating layer over the source region of the first semiconductor layer and contacts the source region of the first semiconductor layer via a first channel hole through the gate insulating layer;
a first drain electrode in direct contact with the drain region of the first semiconductor layer, wherein the first drain electrode is disposed on the gate insulating layer over the drain region of the first semiconductor layer and contacts the drain region of the first semiconductor layer via a second channel hole through the gate insulating layer;
a passivation layer disposed on the first gate electrode, the first source electrode, and the first drain electrode, wherein the passivation layer is in direct contact with the first semiconductor layer in a region between the first source electrode and the first gate electrode, and wherein the passivation layer is in direct contact with the first semiconductor layer in a region between the first gate electrode and the first drain electrode,
wherein the first gate electrode, the first source electrode, and the first drain electrode are in a same layer and comprise a same material.

2. The display device of claim 1, further comprising:
a second semiconductor layer of a second thin film transistor disposed on the buffer layer;
wherein the gate insulating layer is further disposed on a channel region of the second semiconductor layer;
a second gate electrode disposed on the gate insulating layer over the channel region of the second semiconductor layer;
a second source electrode in direct contact with a source region of the second semiconductor;
a second drain electrode in direct contact with a drain region of the second semiconductor layer;
wherein the passivation layer is further disposed on the second gate electrode, the second source electrode, and the second drain electrode, wherein the passivation layer is in direct contact with second semiconductor layer in a region between the second source electrode and the second gate electrode, and wherein the passivation layer is in direct contact with the second semiconductor layer in a region between the second gate electrode and the second drain electrode,
wherein the second gate electrode, the second drain electrode, and the second source electrode are in the same layer and comprise the same material as the first gate electrode, the first source electrode, and the first drain electrode.

3. The display device of claim 1,
wherein the buffer layer is in direct contact with the substrate,
wherein first semiconductor layer is in direct contact with the buffer layer,
wherein the gate insulating layer is in direct contact with the first semiconductor layer,
wherein the first gate electrode is in direct contact with the gate insulating layer, and
wherein the passivation layer is in direct contact with the first gate electrode, the first source electrode, and the first drain electrode.

4. The display device of claim 1, further comprising:
a data line disposed on the substrate, wherein the buffer layer is further disposed on the data line;
a second semiconductor layer disposed on the buffer layer; and
a gate pattern disposed over the buffer layer and in direct contact with the second semiconductor layer, the gate pattern in direct contact with the data line via a hole through the buffer layer.

5. The display device of claim 4, wherein the gate insulating layer is disposed on the first semiconductor layer only on the channel region of the first semiconductor layer and is not disposed on the source region or the drain region of the first semiconductor layer.

6. The display device of claim 5,
wherein the first drain electrode is in direct contact with the drain region of the first semiconductor layer in an entire overlapping region of the first drain electrode and the drain region of the first semiconductor layer; and
wherein the first source electrode is in direct contact with the source region of the first semiconductor layer in an entire overlapping region of the first source electrode and the source region of the first semiconductor layer.

7. The display device of claim 4,
wherein the gate insulating layer is further disposed on the second semiconductor layer and the buffer layer;
wherein the gate pattern is disposed on the gate insulating layer; and
wherein the hole through the buffer layer is further through the gate insulating layer.

8. The display device of claim 1, further comprising:
a light shielding layer disposed on the substrate, wherein the buffer layer is further disposed on the light shielding layer;
a second semiconductor layer disposed on the buffer layer over the light shielding layer;
wherein the passivation layer is further in direct contact with the second semiconductor layer over the light shielding layer; and
a pixel electrode disposed on the passivation layer over the light shielding layer.

9. The display device of claim 8, wherein the light shielding layer is in direct contact with the first source electrode.

10. The display device of claim 1, wherein the display device comprises an organic light emitting diode (OLED) device.

11. A display device comprising:
a substrate;
a buffer layer disposed on the substrate;
a first semiconductor layer of a first thin film transistor disposed on the buffer layer;
a gate insulating layer disposed on a channel region of the first semiconductor layer;
a first gate electrode disposed on the gate insulating layer over the channel region of the first semiconductor layer;
a first source electrode in direct contact with a source region of the first semiconductor layer;
a first drain electrode in direct contact with a drain region of the first semiconductor layer;
wherein the first gate electrode, the first source electrode, and the first drain electrode are in a same layer and comprise a same material;
a passivation layer disposed on the first gate electrode, the first source electrode, and the first drain electrode, wherein the passivation layer is in direct contact with the first semiconductor layer in a region between the first source electrode and the first gate electrode, and wherein the passivation layer is in direct contact with the first semiconductor layer in a region between the first gate electrode and the first drain electrode;
a data line disposed on the substrate, wherein the buffer layer is further disposed on the data line;
a second semiconductor layer disposed on the buffer layer; and
a gate pattern disposed over the buffer layer and in direct contact with the second semiconductor layer, the gate pattern in direct contact with the data line via a hole through the buffer layer.

12. The display device of claim 11,
wherein the gate pattern is in direct contact with the second semiconductor layer and the buffer layer in an entire overlapping region of the gate pattern and the second semiconductor layer.

13. The display device of claim 11, wherein the second semiconductor layer is disposed on the buffer layer without overlapping the data line.

14. The display device of claim 11, wherein the second semiconductor layer is disposed on the buffer layer at least partially overlapping the data line.

15. The display device of claim 11, further comprising:
a third semiconductor layer of a second thin film transistor disposed on the buffer layer;
wherein the gate insulating layer is further disposed on a channel region of the third semiconductor layer;
a second gate electrode disposed on the gate insulating layer over the channel region of the third semiconductor layer;
a second source electrode in direct contact with a source region of the second semiconductor;
a second drain electrode in direct contact with a drain region of the third semiconductor layer;
wherein the passivation layer is further disposed on the second gate electrode, the second source electrode, and the second drain electrode, wherein the passivation layer is in direct contact with second semiconductor layer in a region between the second source electrode and the second gate electrode, and wherein the passivation layer is in direct contact with the second semiconductor layer in a region between the second gate electrode and the second drain electrode,
wherein the second gate electrode, the second drain electrode, and the second source electrode are in the same layer and comprise the same material as the first gate electrode, the first source electrode, and the first drain electrode.

16. The display device of claim 11,
wherein the buffer layer is in direct contact with the substrate,
wherein first semiconductor layer is in direct contact with the buffer layer,
wherein the gate insulating layer is in direct contact with the first semiconductor layer,
wherein the first gate electrode is in direct contact with the gate insulating layer, and
wherein the passivation layer is in direct contact with the first gate electrode, the first source electrode, and the first drain electrode.

17. The display device of claim 11,
wherein the gate insulating layer is further disposed on a source region of the first semiconductor layer and on a drain region of the first semiconductor layer;
wherein the first source electrode is disposed on the gate insulating layer over the source region of the first semiconductor layer and contacts the source region of the first semiconductor layer via a first channel hole through the gate insulating layer; and
wherein the first drain electrode is disposed on the gate insulating layer over the drain region of the first semiconductor layer and contacts the drain region of the first semiconductor layer via a second channel hole through the gate insulating layer.

18. The display device of claim 11, further comprising:
a light shielding layer disposed on the substrate, wherein the buffer layer is further disposed on the light shielding layer;

a third semiconductor layer disposed on the buffer layer over the light shielding layer;

wherein the passivation layer is further in direct contact with the third semiconductor layer over the light shielding layer; and a pixel electrode disposed on the passivation layer over the light shielding layer.

19. The display device of claim 11, wherein the display device comprises an organic light emitting diode (OLED) device.

20. The display device of claim 11, wherein the gate insulating layer is further disposed on the second semiconductor layer and the buffer layer;

wherein the gate pattern is disposed on the gate insulating layer; and wherein the hole through the buffer layer is further through the gate insulating layer.

* * * * *